INVENTORS
GEORGE G. GORBATENKO
MILTON J. KIMMEL
BY Richard H. Smith
ATTORNEY

Feb. 3, 1970 G. G. GORBATENKO ET AL 3,493,958

BIPOLAR ANALOG TO DIGITAL CONVERTER

Filed Oct. 7, 1965 14 Sheets-Sheet 3

BIPOLAR ANALOG TO DIGITAL CONVERTER

Filed Oct. 7, 1965

FIG. 8b

| | LEVEL OF SIGNAL ON LINES 14-14a | | INPUTS TO CIRCUIT 700 | | | | | | | | | OUTPUTS FROM CIRCUIT 700 | | | | |
|---|---|---|---|---|---|---|---|---|---|---|---|---|---|---|---|---|
| | | | 18a | 18b | 18c | 18d | 18e | 18f | 18g | 18h | 18i | $\bar{4}$ | $\bar{2}$ | $\bar{1}$ | M | P |
| EQUAL TO OR GREATER THAN | $\bar{10}$ V. | A | 1 | 1 | 1 | 1 | 1 | 1 | 1 | 1 | 1 | 1 | 1 | 1 | 0 | 1 |
| | $\bar{7}$ V. | | 0 | 1 | 1 | 1 | 1 | 1 | 1 | 1 | 1 | 1 | 1 | 1 | 0 | 0 |
| | $\bar{6}$ V. | | 0 | 0 | 1 | 1 | 1 | 1 | 1 | 1 | 1 | 1 | 1 | 0 | 0 | 0 |
| | $\bar{5}$ V. | | 0 | 0 | 0 | 1 | 1 | 1 | 1 | 1 | 1 | 1 | 0 | 1 | 0 | 0 |
| | $\bar{4}$ V. | | 0 | 0 | 0 | 0 | 1 | 1 | 1 | 1 | 1 | 1 | 0 | 0 | 0 | 0 |
| | $\bar{3}$ V. | | 0 | 0 | 0 | 0 | 0 | 1 | 1 | 1 | 1 | 0 | 1 | 1 | 0 | 0 |
| | $\bar{2}$ V. | | 0 | 0 | 0 | 0 | 0 | 0 | 1 | 1 | 1 | 0 | 1 | 0 | 0 | 0 |
| | $\bar{1}$ V. | | 0 | 0 | 0 | 0 | 0 | 0 | 0 | 1 | 1 | 0 | 0 | 1 | 0 | 0 |
| | $\bar{0}$ V. | | 0 | 0 | 0 | 0 | 0 | 0 | 0 | 0 | 1 | 0 | 0 | 0 | 0 | 0 |
| LESS THAN | $\bar{0}$ V. | | 0 | 0 | 0 | 0 | 0 | 0 | 0 | 0 | 0 | 1 | 1 | 1 | 1 | 0 |
| | -$\bar{1}$ V. | | 0 | 0 | 0 | 0 | 0 | 0 | 0 | 1 | 0 | 1 | 1 | 0 | 1 | 0 |
| | -$\bar{2}$ V. | | 0 | 0 | 0 | 0 | 0 | 0 | 1 | 1 | 0 | 1 | 0 | 1 | 1 | 0 |
| | -$\bar{3}$ V. | | 0 | 0 | 0 | 0 | 0 | 1 | 1 | 1 | 0 | 1 | 0 | 0 | 1 | 0 |
| | -$\bar{4}$ V. | | 0 | 0 | 0 | 0 | 1 | 1 | 1 | 1 | 0 | 0 | 1 | 1 | 1 | 0 |
| | -$\bar{5}$ V. | | 0 | 0 | 0 | 1 | 1 | 1 | 1 | 1 | 0 | 0 | 1 | 0 | 1 | 0 |
| | -$\bar{6}$ V. | | 0 | 0 | 1 | 1 | 1 | 1 | 1 | 1 | 0 | 0 | 0 | 1 | 1 | 0 |
| | -$\bar{7}$ V. | | 0 | 1 | 1 | 1 | 1 | 1 | 1 | 1 | 0 | 0 | 0 | 0 | 1 | 0 |
| | -$\bar{10}$ V. | | 0 | 1 | 1 | 1 | 1 | 1 | 1 | 1 | 0 | 0 | 0 | 0 | 1 | 0 |
| EQUAL TO OR GREATER THAN | $\bar{10}$ V. | B | 1 | 1 | 1 | 1 | 1 | 1 | 1 | 1 | 1 | 1 | 1 | 1 | 0 | 1 |
| | $\bar{7}$ V. | | 0 | 1 | 1 | 1 | 1 | 1 | 1 | 1 | 1 | 1 | 1 | 1 | 0 | 0 |
| | $\bar{6}$ V. | | 0 | 0 | 1 | 1 | 1 | 1 | 1 | 1 | 1 | 1 | 1 | 0 | 0 | 0 |
| | $\bar{5}$ V. | | 0 | 0 | 0 | 1 | 1 | 1 | 1 | 1 | 1 | 1 | 0 | 1 | 0 | 0 |
| | $\bar{4}$ V. | | 0 | 0 | 0 | 0 | 1 | 1 | 1 | 1 | 1 | 1 | 0 | 0 | 0 | 0 |
| | $\bar{3}$ V. | | 0 | 0 | 0 | 0 | 0 | 1 | 1 | 1 | 1 | 0 | 1 | 1 | 0 | 0 |
| | $\bar{2}$ V. | | 0 | 0 | 0 | 0 | 0 | 0 | 1 | 1 | 1 | 0 | 1 | 0 | 0 | 0 |
| | $\bar{1}$ V. | | 0 | 0 | 0 | 0 | 0 | 0 | 0 | 1 | 1 | 0 | 0 | 1 | 0 | 0 |
| | $\bar{0}$ V. | | 0 | 0 | 0 | 0 | 0 | 0 | 0 | 0 | 1 | 0 | 0 | 0 | 0 | 0 |
| LESS THAN | $\bar{0}$ V. | | 0 | 0 | 0 | 0 | 0 | 0 | 0 | 0 | 0 | 0 | 0 | 0 | 1 | 0 |

| | INPUTS TO 801-801a | | | | | | | OUTPUTS | | | | |
|---|---|---|---|---|---|---|---|---|---|---|---|---|
| | M (SIGN) | $\bar{4}$ | $\bar{2}$ | $\bar{1}$ | P | C | B | OV'FL | SIGN | $\bar{4}$ | $\bar{2}$ | $\bar{1}$ |
| A | 0 | 0 | 0 | 0 | 0 | 0 | 0 | 0 | 0 | 0 | 0 | 0 |
| | 0 | 0 | 0 | 1 | 0 | 0 | 0 | 0 | 0 | 0 | 0 | 1 |
| | 0 | 0 | 1 | 0 | 0 | 0 | 0 | 0 | 0 | 0 | 1 | 0 |
| | 0 | 0 | 1 | 1 | 0 | 0 | 0 | 0 | 0 | 0 | 1 | 1 |
| | 0 | 1 | 0 | 0 | 0 | 0 | 0 | 0 | 0 | 1 | 0 | 0 |
| | 0 | 1 | 0 | 1 | 0 | 0 | 0 | 0 | 0 | 1 | 0 | 1 |
| | 0 | 1 | 1 | 0 | 0 | 0 | 0 | 0 | 0 | 1 | 1 | 0 |
| | 0 | 1 | 1 | 1 | 0 | 0 | 0 | 0 | 0 | 1 | 1 | 1 |
| B | 1 | 1 | 1 | 1 | 0 | 0 | 0 | 0 | 1 | 1 | 1 | 1 |
| | 1 | 1 | 1 | 0 | 0 | 0 | 0 | 0 | 1 | 1 | 1 | 0 |
| | 1 | 1 | 0 | 1 | 0 | 0 | 0 | 0 | 1 | 1 | 0 | 1 |
| | 1 | 1 | 0 | 0 | 0 | 0 | 0 | 0 | 1 | 1 | 0 | 0 |
| | 1 | 0 | 1 | 1 | 0 | 0 | 0 | 0 | 1 | 0 | 1 | 1 |
| | 1 | 0 | 1 | 0 | 0 | 0 | 0 | 0 | 1 | 0 | 1 | 0 |
| | 1 | 0 | 0 | 1 | 0 | 0 | 0 | 0 | 1 | 0 | 0 | 1 |
| | 1 | 0 | 0 | 0 | 0 | 0 | 0 | 0 | 1 | 0 | 0 | 0 |
| C | 0 | 0 | 0 | 0 | 0 | 1 | 0 | 0 | 0 | 0 | 0 | 1 |
| | 0 | 0 | 0 | 1 | 0 | 1 | 0 | 0 | 0 | 0 | 1 | 0 |
| | 0 | 0 | 1 | 0 | 0 | 1 | 0 | 0 | 0 | 0 | 1 | 1 |
| | 0 | 0 | 1 | 1 | 0 | 1 | 0 | 0 | 0 | 1 | 0 | 0 |
| | 0 | 1 | 0 | 0 | 0 | 1 | 0 | 0 | 0 | 1 | 0 | 1 |
| | 0 | 1 | 0 | 1 | 0 | 1 | 0 | 0 | 0 | 1 | 1 | 0 |
| | 0 | 1 | 1 | 0 | 0 | 1 | 0 | 0 | 0 | 1 | 1 | 1 |
| | 0 | 1 | 1 | 1 | 0 | 1 | 0 | 1 | 0 | 0 | 0 | 0 |
| D | 1 | 1 | 1 | 1 | 0 | 1 | 0 | 0 | 0 | 0 | 0 | 0 |
| | 1 | 1 | 1 | 0 | 0 | 1 | 0 | 0 | 1 | 1 | 1 | 1 |
| | 1 | 1 | 0 | 1 | 0 | 1 | 0 | 0 | 1 | 1 | 1 | 0 |
| | 1 | 1 | 0 | 0 | 0 | 1 | 0 | 0 | 1 | 1 | 0 | 1 |
| | 1 | 0 | 1 | 1 | 0 | 1 | 0 | 0 | 1 | 1 | 0 | 0 |
| | 1 | 0 | 1 | 0 | 0 | 1 | 0 | 0 | 1 | 0 | 1 | 1 |
| | 1 | 0 | 0 | 1 | 0 | 1 | 0 | 0 | 1 | 0 | 1 | 0 |
| | 1 | 0 | 0 | 0 | 0 | 1 | 0 | 0 | 1 | 0 | 0 | 1 |
| E | 0 | 0 | 0 | 0 | 0 | 0 | 1 | 0 | 1 | 1 | 1 | 1 |
| | 0 | 0 | 0 | 1 | 0 | 0 | 1 | 0 | 0 | 0 | 0 | 0 |
| | 0 | 0 | 1 | 0 | 0 | 0 | 1 | 0 | 0 | 0 | 0 | 1 |
| | 0 | 0 | 1 | 1 | 0 | 0 | 1 | 0 | 0 | 0 | 1 | 0 |
| | 0 | 1 | 0 | 0 | 0 | 0 | 1 | 0 | 0 | 0 | 1 | 1 |
| | 0 | 1 | 0 | 1 | 0 | 0 | 1 | 0 | 0 | 1 | 0 | 0 |
| | 0 | 1 | 1 | 0 | 0 | 0 | 1 | 0 | 0 | 1 | 0 | 1 |
| | 0 | 1 | 1 | 1 | 0 | 0 | 1 | 0 | 0 | 1 | 1 | 0 |
| F | 1 | 1 | 1 | 1 | 0 | 0 | 1 | 0 | 1 | 1 | 1 | 0 |
| | 1 | 1 | 1 | 0 | 0 | 0 | 1 | 0 | 1 | 1 | 0 | 1 |
| | 1 | 1 | 0 | 1 | 0 | 0 | 1 | 0 | 1 | 1 | 0 | 0 |
| | 1 | 1 | 0 | 0 | 0 | 0 | 1 | 0 | 1 | 0 | 1 | 1 |
| | 1 | 0 | 1 | 1 | 0 | 0 | 1 | 0 | 1 | 0 | 1 | 0 |
| | 1 | 0 | 1 | 0 | 0 | 0 | 1 | 0 | 1 | 0 | 0 | 1 |
| | 1 | 0 | 0 | 1 | 0 | 0 | 1 | 0 | 1 | 0 | 0 | 0 |
| | 1 | 0 | 0 | 0 | 0 | 0 | 1 | 1 | 1 | 1 | 1 | 1 |

FIG. 11b

| | INPUTS TO 801-801a | | | | | | | OUTPUTS | | | | |
|---|---|---|---|---|---|---|---|---|---|---|---|---|
| | M (SIGN) | $\bar{4}$ | $\bar{2}$ | $\bar{1}$ | P | C | B | OV'FL | SIGN | $\bar{4}$ | $\bar{2}$ | $\bar{1}$ |
| G | 0 | 1 | 1 | 1 | 1 | 0 | 0 | 1 | 0 | 0 | 0 | 0 |
| G | 1 | 0 | 0 | 0 | 0 | 0 | 0 | 0 | 1 | 0 | 0 | 0 |
| H | 0 | 1 | 1 | 1 | 1 | 1 | 0 | 1 | 0 | 0 | 0 | 1 |
| H | 0 | 1 | 1 | 1 | 1 | 0 | 1 | 0 | 0 | 1 | 1 | 1 |
| H | 1 | 0 | 0 | 0 | 0 | 0 | 1 | 1 | 1 | 1 | 1 | 1 |

FIG. 11c

| | INPUTS | | | | | | | OUTPUTS | | | | |
|---|---|---|---|---|---|---|---|---|---|---|---|---|
| | $\bar{4}$ | $\bar{2}$ | $\bar{1}$ | M | P | C | B | C | B | $\bar{4}$ | $\bar{2}$ | $\bar{1}$ |
| A | 0 | 0 | 0 | 0 | 0 | 0 | 0 | 0 | 0 | 0 | 0 | 0 |
| | 0 | 0 | 1 | 0 | 0 | 0 | 0 | 0 | 0 | 0 | 0 | 1 |
| | 0 | 1 | 0 | 0 | 0 | 0 | 0 | 0 | 0 | 0 | 1 | 0 |
| | 0 | 1 | 1 | 0 | 0 | 0 | 0 | 0 | 0 | 0 | 1 | 1 |
| | 1 | 0 | 0 | 0 | 0 | 0 | 0 | 0 | 0 | 1 | 0 | 0 |
| | 1 | 0 | 1 | 0 | 0 | 0 | 0 | 0 | 0 | 1 | 0 | 1 |
| | 1 | 1 | 0 | 0 | 0 | 0 | 0 | 0 | 0 | 1 | 1 | 0 |
| | 1 | 1 | 1 | 0 | 0 | 0 | 0 | 0 | 0 | 1 | 1 | 1 |
| B | 0 | 0 | 0 | 0 | 0 | 1 | 0 | 0 | 0 | 0 | 0 | 1 |
| | 0 | 0 | 1 | 0 | 0 | 1 | 0 | 0 | 0 | 0 | 1 | 0 |
| | 0 | 1 | 0 | 0 | 0 | 1 | 0 | 0 | 0 | 0 | 1 | 1 |
| | 0 | 1 | 1 | 0 | 0 | 1 | 0 | 0 | 0 | 1 | 0 | 0 |
| | 1 | 0 | 0 | 0 | 0 | 1 | 0 | 0 | 0 | 1 | 0 | 1 |
| | 1 | 0 | 1 | 0 | 0 | 1 | 0 | 0 | 0 | 1 | 1 | 0 |
| | 1 | 1 | 0 | 0 | 0 | 1 | 0 | 0 | 0 | 1 | 1 | 1 |
| | 1 | 1 | 1 | 0 | 0 | 1 | 0 | 0 | 0 | 0 | 0 | 0 |
| C | 0 | 0 | 0 | 0 | 0 | 0 | 1 | 0 | 1 | 1 | 1 | 1 |
| | 0 | 0 | 1 | 0 | 0 | 0 | 1 | 0 | 0 | 0 | 0 | 0 |
| | 0 | 1 | 0 | 0 | 0 | 0 | 1 | 0 | 0 | 0 | 0 | 1 |
| | 0 | 1 | 1 | 0 | 0 | 0 | 1 | 0 | 0 | 0 | 1 | 0 |
| | 1 | 0 | 0 | 0 | 0 | 0 | 1 | 0 | 0 | 0 | 1 | 1 |
| | 1 | 0 | 1 | 0 | 0 | 0 | 1 | 0 | 0 | 1 | 0 | 0 |
| | 1 | 1 | 0 | 0 | 0 | 0 | 1 | 0 | 0 | 1 | 0 | 1 |
| | 1 | 1 | 1 | 0 | 0 | 0 | 1 | 0 | 0 | 1 | 1 | 0 |
| D | 0 | 0 | 0 | 1 | 0 | 0 | 0 | 0 | 1 | 1 | 1 | 1 |
| | 1 | 1 | 1 | 0 | 1 | 0 | 0 | 1 | 0 | 0 | 0 | 0 |
| E | 0 | 0 | 0 | 1 | 0 | 1 | 0 | 0 | 0 | 0 | 0 | 0 |
| | 0 | 0 | 0 | 1 | 0 | 0 | 1 | 0 | 1 | 1 | 1 | 0 |
| | 1 | 1 | 1 | 0 | 1 | 1 | 0 | 1 | 0 | 0 | 0 | 1 |
| | 1 | 1 | 1 | 0 | 1 | 0 | 1 | 0 | 0 | 1 | 1 | 0 |

FIG. 12b

United States Patent Office 3,493,958
Patented Feb. 3, 1970

3,493,958

BIPOLAR ANALOG TO DIGITAL CONVERTER

George G. Gorbatenko and Milton J. Kimmel, Rochester, Minn., assignors to International Business Machines Corporation, Armonk, N.Y., a corporation of New York Filed Oct. 7, 1965, Ser. No. 493,798
Int. Cl. H04l *3/00;* G06f *5/02*
U.S. Cl. 340—347 11 Claims

ABSTRACT OF THE DISCLOSURE

The disclosed successive-approximation analog to digital converter has a comparator which provides bipolar signal-level detection in determining the most significant output digit. The comparator output is encoded as the true value of the first conversion digit when the analog-signal polarity is positive and as the complementary value of the digit when the analog-signal polarity is negative. An analog representation of the encoded value is subtracted from the analog signal, resulting in a positive difference signal regardless of the analog-signal polarity. The remainder of the conversion then takes place in the same manner for both positive and negative analog signals. An error-correcting feature becomes operative automatically when an incorrect digit conversion presents an out-of-range signal to the comparator.

The present invention relates to bipolar "successive approximation" analog to digital converters and, more particularly, to such a converter incorporating means operative during a conversion cycle to correct conversion errors, including errors in sign, occurring during the same cycle.

The so-called "successive approximation" technique of analog to digital conversion is a well-known method for producing accurate and, when implemented through electronic means, relatively high speed digital conversions. Prior art electronic converters operating on this principle compare the unknown analog voltage to be digitized with one or a plurality of precisely known reference voltages in a series of digit generating comparison steps. In each step the relative magnitudes of the analog input or some fraction thereof and the reference voltage are compared; and, based on this comparison an "error" or difference voltage is generated which is compared with another reference voltage during the succeeding step. Each comparison step yields a digit of the final output and the digits are produced in descending digital order until the the desired level of quantization is reached.

To enable an analog to digital converter operating on this technique to handle bipolar inputs, several schemes are known to the prior art. One very straightforward bipolar scheme calls simply for the use of two separate converters, one set up to handle positive inputs and the other to handle negative inputs. A polarity detection circuit at the common input to the two converters determines the sign of the input voltage and operates appropriate gating circuits to cause the input signal to be channeled to the proper converter. It is apparent that this scheme is costly since it requires two complete converters to obtain but a single conversion and is subject to erroneous operation to the extent that there is no way to correct for an initial wrong decision made by the polarity detection circuit. Further, this scheme detracts from the speed of the conversion in that some initial period of time is required to make the polarity decision before the digit generation circuitry can begin to operate.

Another scheme involves the use of a single, unipolar analog to digital converter equipped with means at its input for detecting the polarity of the analog signal and for inverting the polarity of the signal so that inputs to the converter are always of the same polarity. The advantage of this scheme over that mentioned above is in the hardware reduction resulting from the use of only a single converter circuit. The same speed and reliability drawbacks pertain, however. In addition, there is the further drawback that the analog input signal is likely to be degraded in undergoing the initial polarity inversion.

A third bipolar scheme operates upon the philosophy of the above-mentioned first scheme but achieves somewhat the same hardware saving of the scheme just mentioned in that it employs a single analog to digital converter having the necessary extra circuits to enable it to operate on both positive and negative input signals. Again, an initial polarity detection circuit is necessary in order to switch the converter to the proper mode of operation and, as before, this initial polarity decision step detracts from overall conversion speed. Further, no means are provided in this scheme for correcting the effects of an initial erroneous polarity decision.

It is therefore an object of the present invention to provide an improved bipolar "successive approximation" type analog to digital converter which eliminates the aforementioned drawbacks of the prior art.

It is a further object to extend the principle of the error correcting unipolar analog to digital converter disclosed in co-pending patent application Ser. No. 474,255, filed July 23, 1965, to provide a bipolar converter possessing all the features and advantages appertaining thereto and further having the capability of correcting the effects of an initial wrong decision made by the polarity determining circuits.

Another object is to provide a bipolar analog to digital converter of the "successive approximation" type which determines the polarity of the input analog signal coincidentally with a determination of the first output digit, thereby eliminating the need for a separate polarity determination time interval.

Still another object is to provide a bipolar analog to digital converter of the "successive approximation" type which, except for the circuits which determine the first output digit, is constructed and operates identically to a unipolar converter.

Still a further object is to provide an improved bipolar analog to digital converter of the "successive approximation" type which inherently produces a digital output which is directly usable in a data processing system employing the digital complement form of sign notation.

In accordance with the invention a comparator circuit which provides bipolar signal level detection during the interval in which the first (most significant) output digit is determined produces indications of both the sign and the magnitude of the first output digit during the first comparison operation. Further, the output of the comparison circuit is employed in such a manner as to cause the difference signal generated after determination of the first digit to assume the same polarity (assuming a correct first comparison) regardless of the polarity of the analog input signal. This is done by utilizing the output of the comparator circuit to derive an indication of the true first conversion digit when the polarity of the input signal is detected to be positive and utilizing the comparator output to derive an indication of a digit which is complementary to the true first conversion digit when a negative input is detected. Subtraction from the input signal, of an analog level proportional to the first digit representation in the case of a positive input signal and proportional to the complement of the first digit representation in the case of a negative input signal always results in a positive difference signal thereby permitting the remainder of the conversion to take place in the same manner for both positive and negative inputs. Furthermore, the digital output generated in the case of a negative input is automatically the complement of the true output.

Error correction in the converter of the invention operates upon the principle that an incorrect comparison decision which generates erroneous sign and digit representations during the first digit generation period results in the production of a difference signal having a magnitude which is outside the range of voltages normally presented for comparison during the second digit generation step. Taking into consideration the known tolerance level of the circuit and calculating the maximum error of which the circuit is capable in the worst case, the occurrence of such an out of range signal is an indication not only of the fact that an incorrect decision occurred but is an indication of the magnitude of the error as well. Consequently, in the circuit of the invention means are provided for detecting such out of range signals and for utilizing information thus obtained to correct the erroneous sign and digit representations. Furthermore, means are provided for handling such out of range signals just as though they were normal difference signals resulting from a correct comparison decision. This eliminates any necessity for "retracing" the conversion process after an error has been detected and corrected. Still further means are provided for performing such correction operations substantially at the instant they occur, therefore permitting execution of a conversion in substantially the same amount of time as would be required for a circuit not embodying the novel sign and digit correction feature of the invention.

The foregoing and other objects, features and advantages of the invention will be apparent from the following more particular description of a preferred embodiment of the invention as illustrated in the accompanying drawings.

Figure 4A:
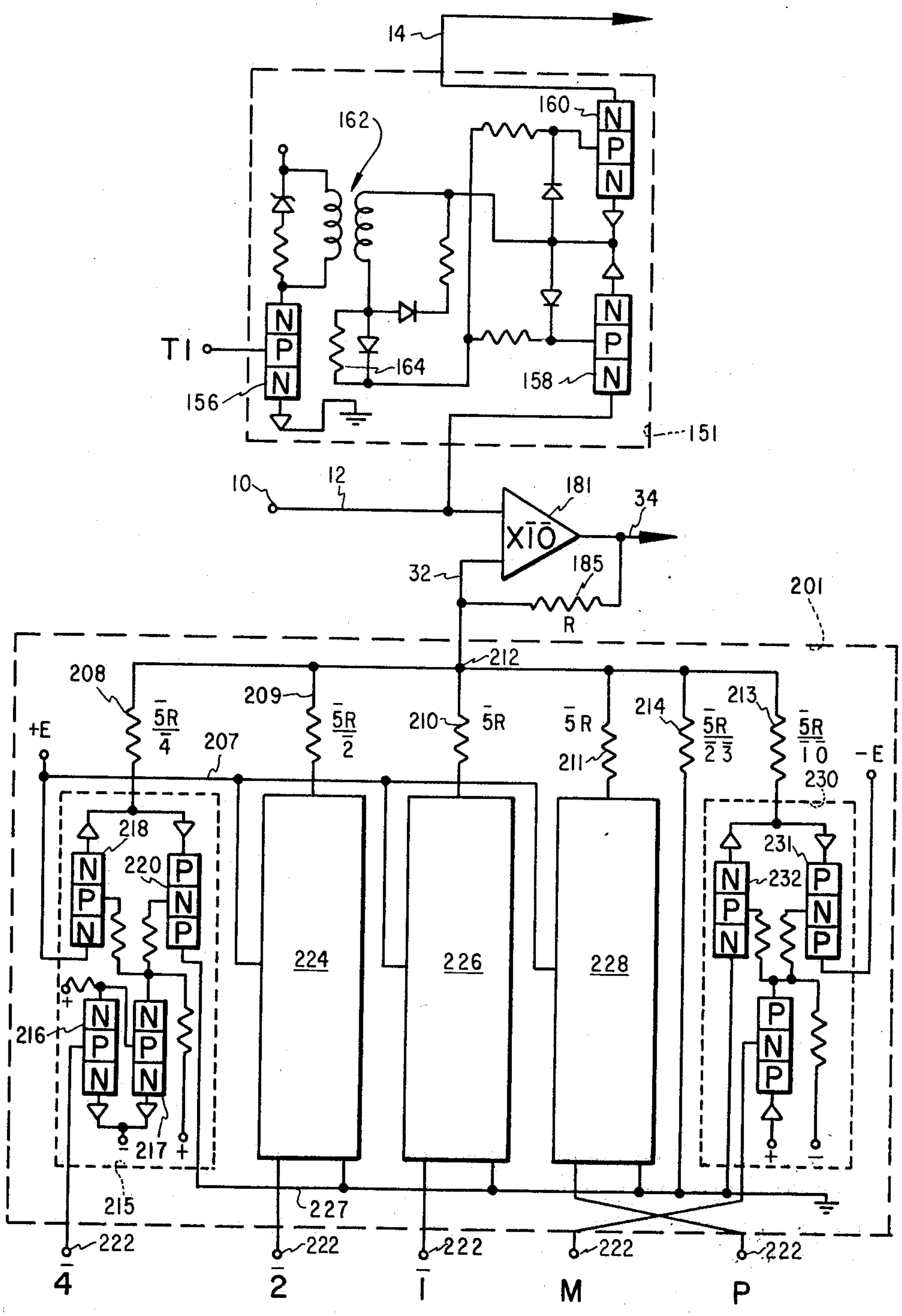

FIG. 4*a* is a circuit diagram showing the circuit details of the first digit generation stage input switch 151 and bipolar digital to analog converter 201.

Figure 4B:
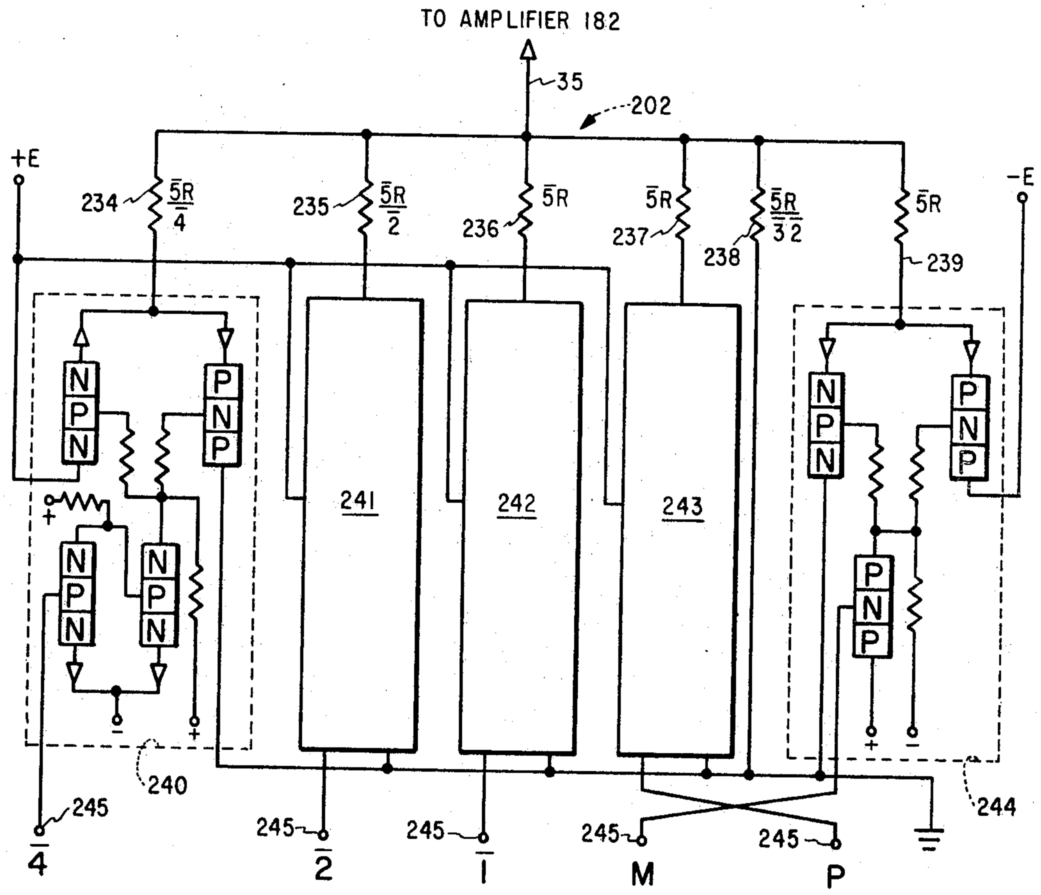

FIG. 4*b* is a circuit diagram showing the circuit details of the second digit generation stage unipolar digital to analog converter 202.

Figure 5:
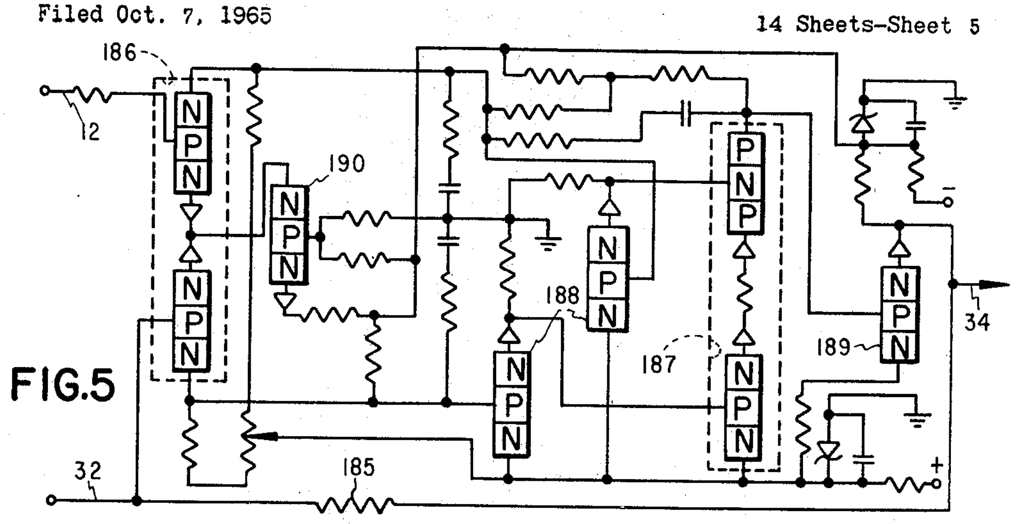

FIG. 5 is a circuit diagram of radix amplifier 181.

Figure 6:
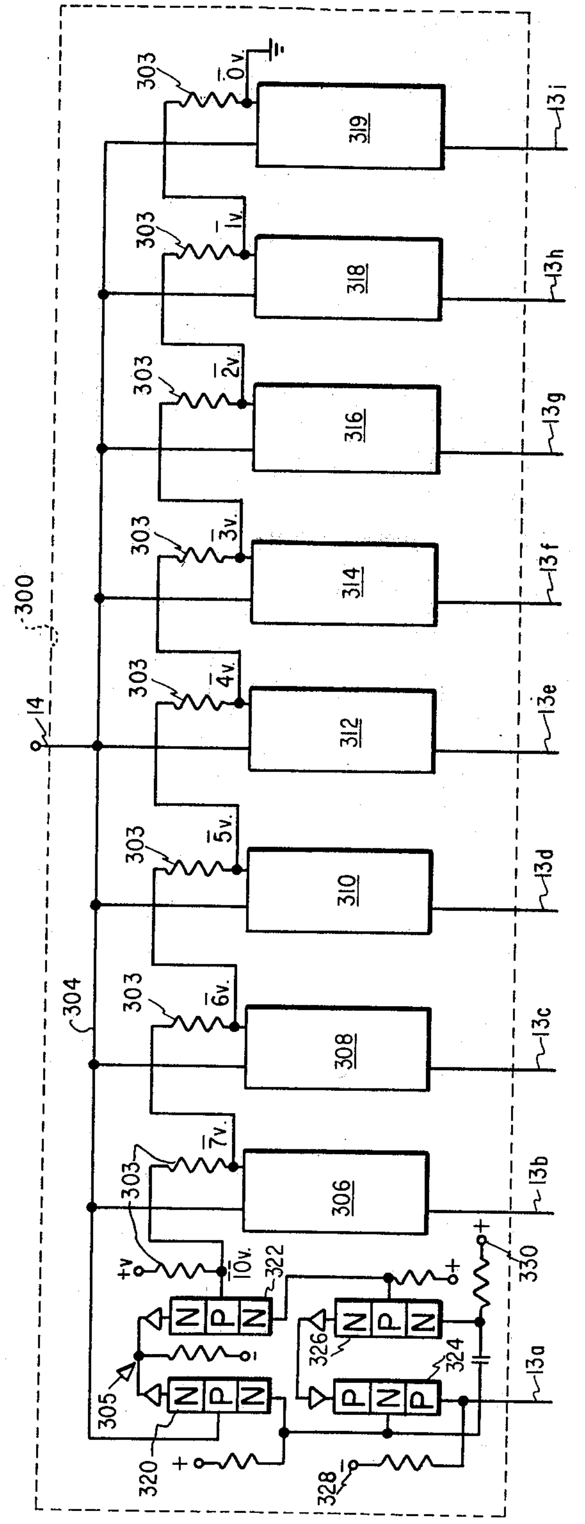

FIG. 6 is a schematic diagram of the positive comparator bank 300.

Figure 7:
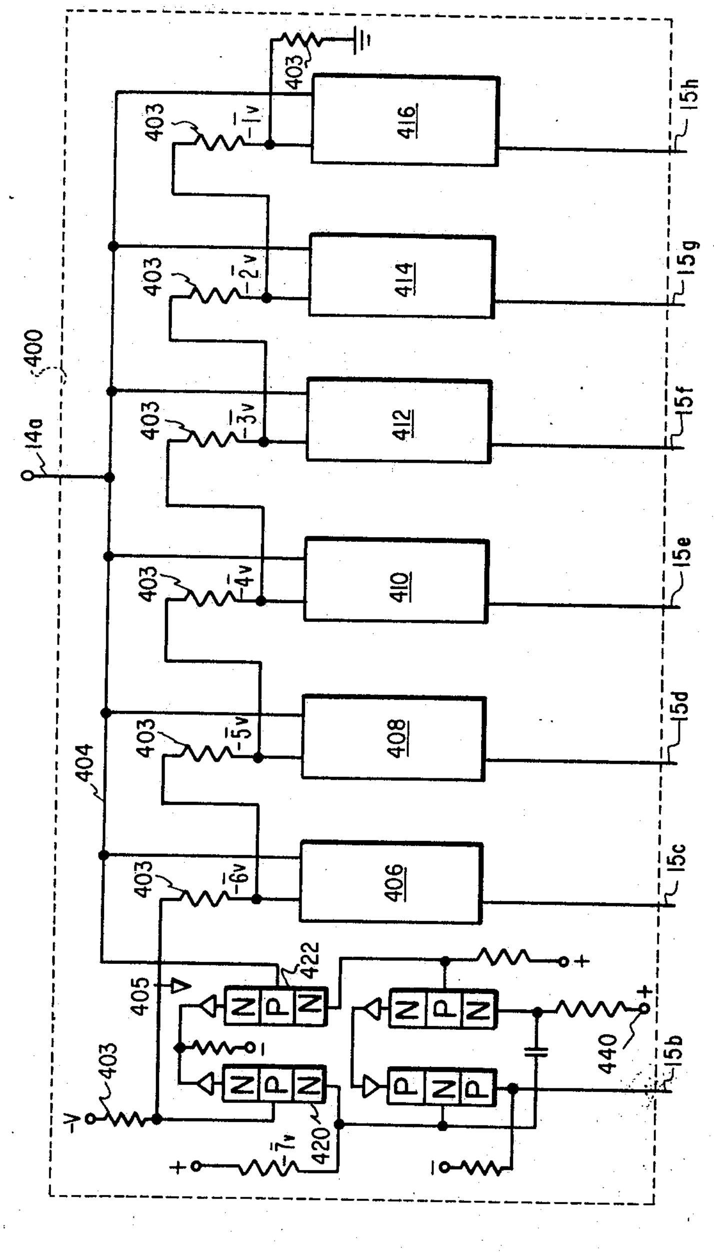

FIG. 7 is a schematic diagram of the negative comparator bank 400.

Figure 8A:
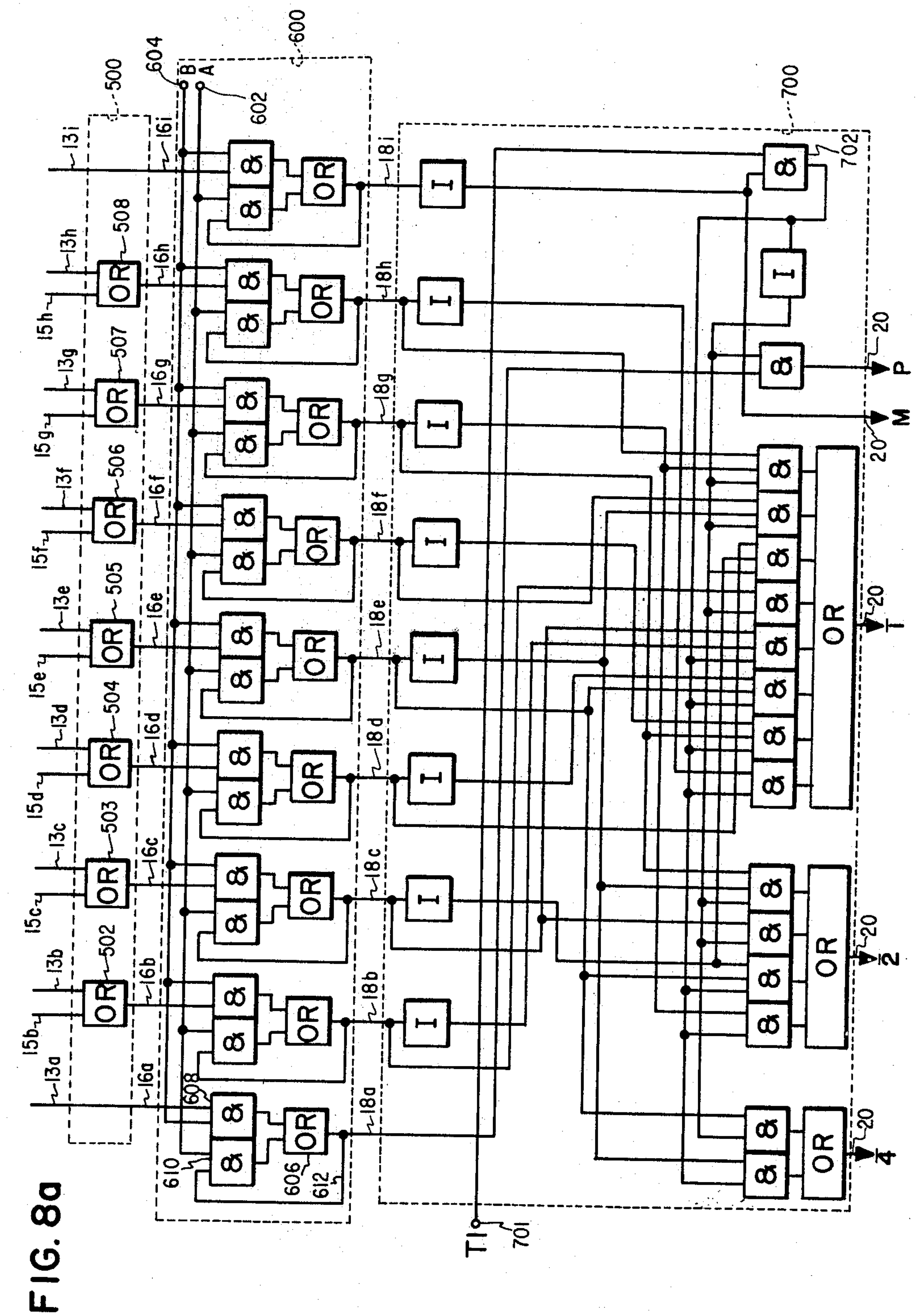

FIG. 8*a* is a schematic diagram of the comparator mix circuit 500, the comparator register 600 and the encode circuit 700.

FIG. 8*b* is a truth table showing all possible combinations of inputs to encode circuit 700 and the outputs produced in response thereto.

Figure 9:
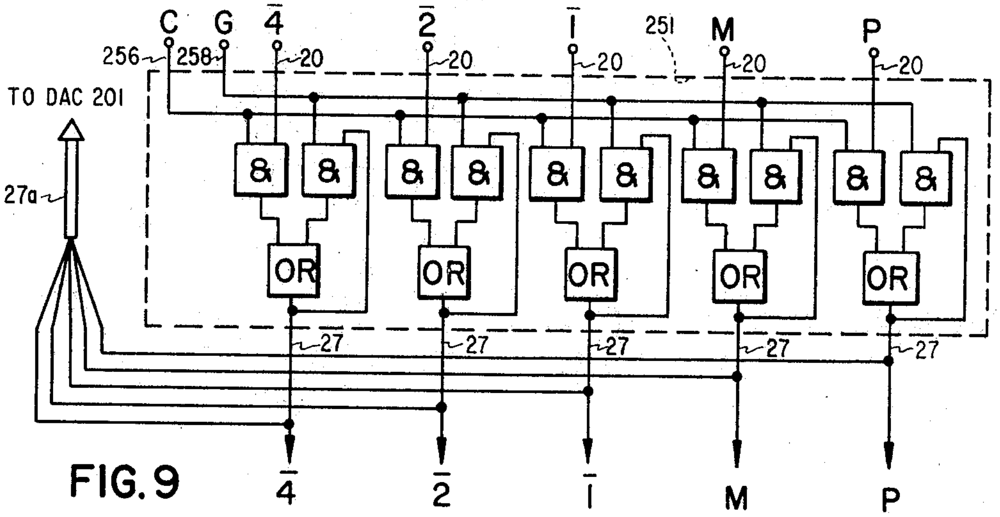

FIG. 9 is a schematic diagram of the first stage DAC register 251.

Figure 10:
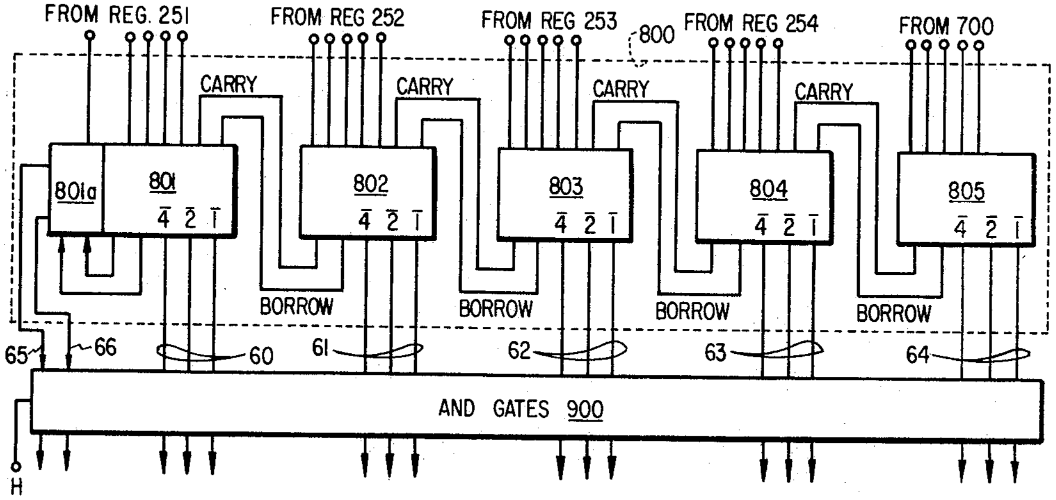

FIG. 10 is a schematic diagram showing the general arrangement of the adder network 800 and its relationship with the output AND gates 900.

Figure 11A:
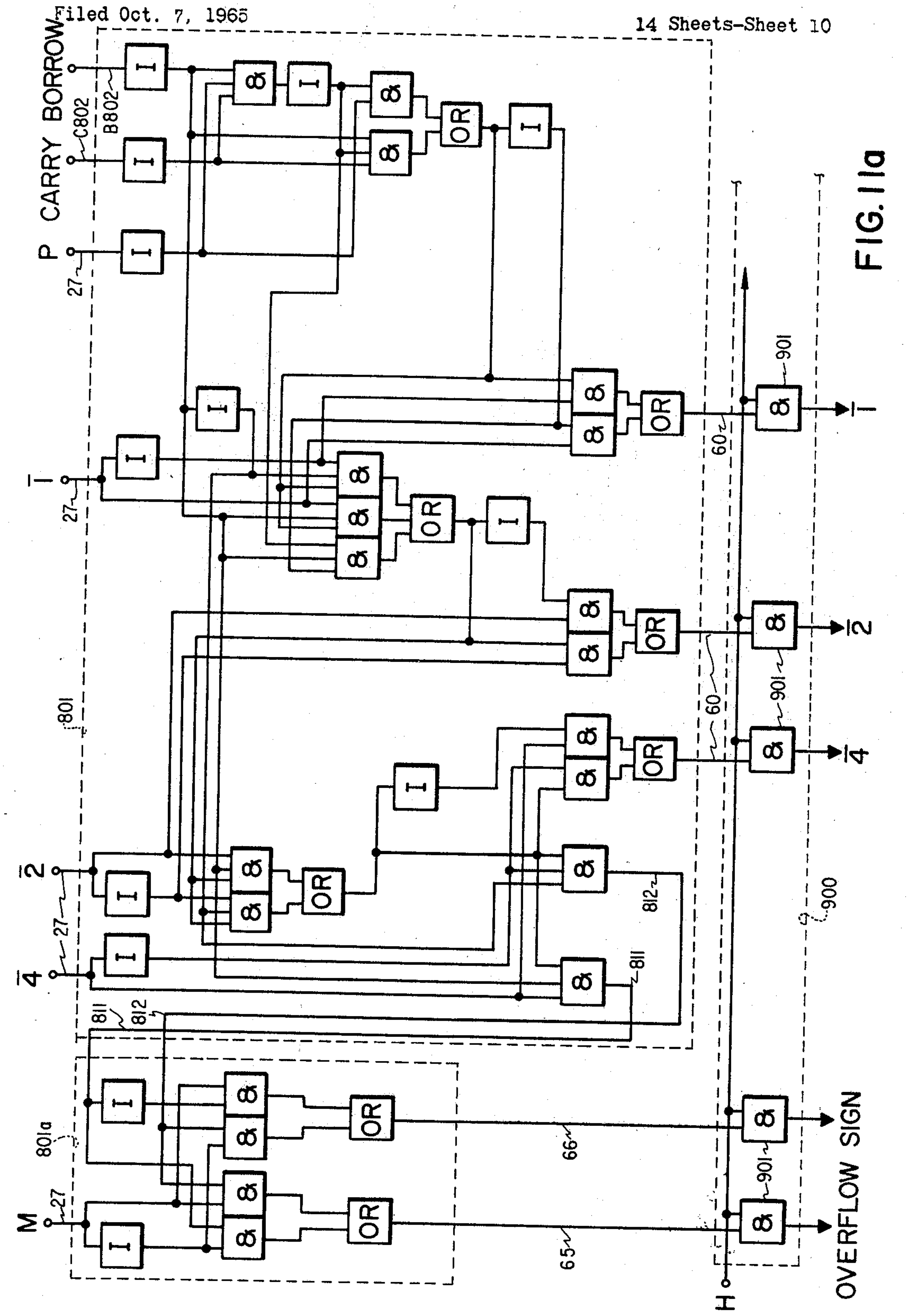

FIG. 11*a* is a circuit diagram of the adder circuit 801, sign generation circuit **801*a* and the AND gates 900** associated therewith shown in FIG. 10.

FIG. 11*b* is a truth table showing four groups of possible combinations of inputs to the circuits 801 and **801*a*** and the outputs produced in response thereto.

FIG. 11*c* is a truth table showing the remaining possible combinations of inputs to circuits 801 and **801*a*** and the outputs produced in response thereto.

Figure 12A:
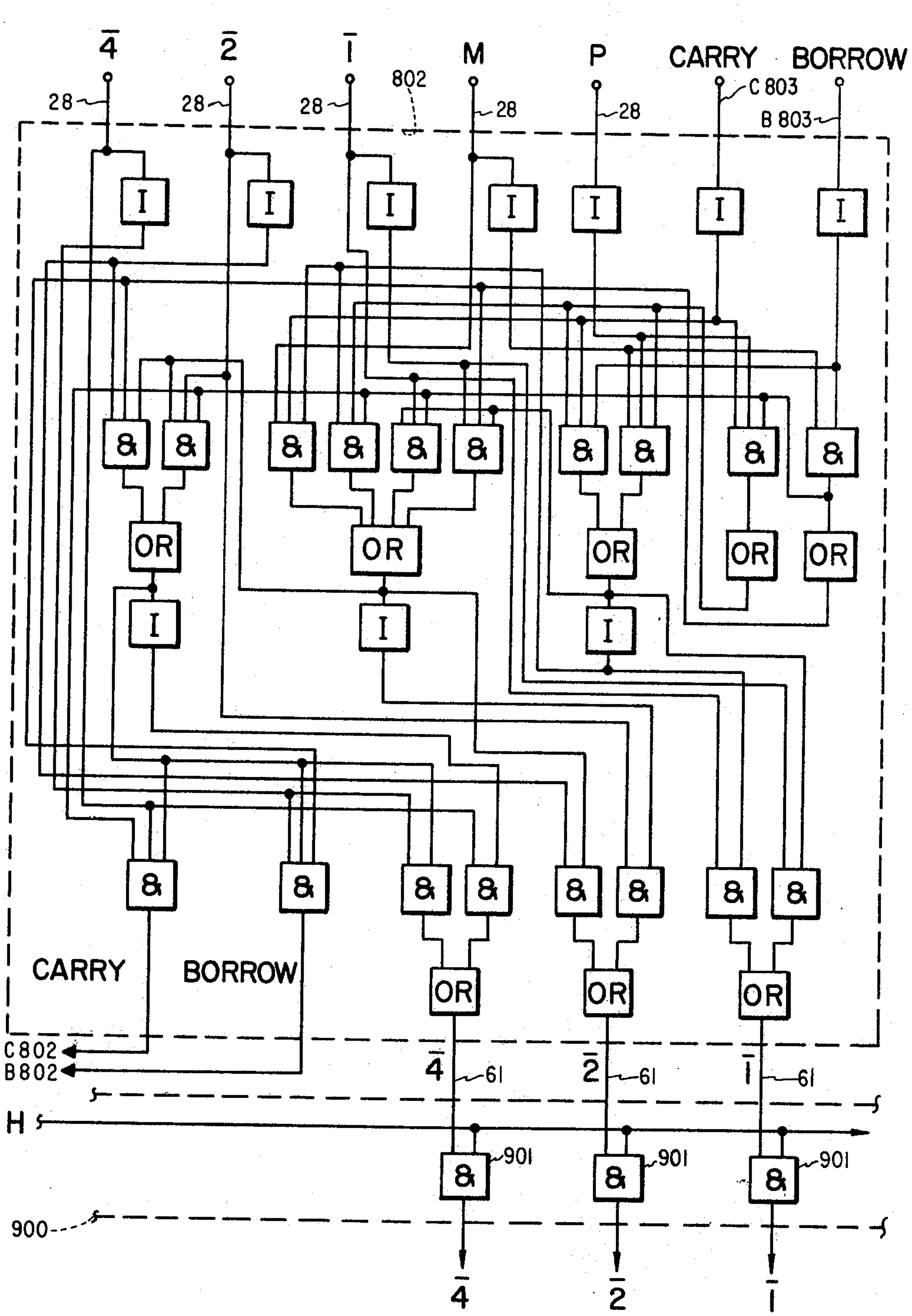

FIG. 12*a* is a circuit diagram of the adder circuit 802 and the AND gates 900 associated therewith shown in FIG. 10.

FIG. 12*b* is a truth table showing all possible combination of inputs to adder 802 and the outputs produced in response thereto.

Overall circuit

Figure 1:
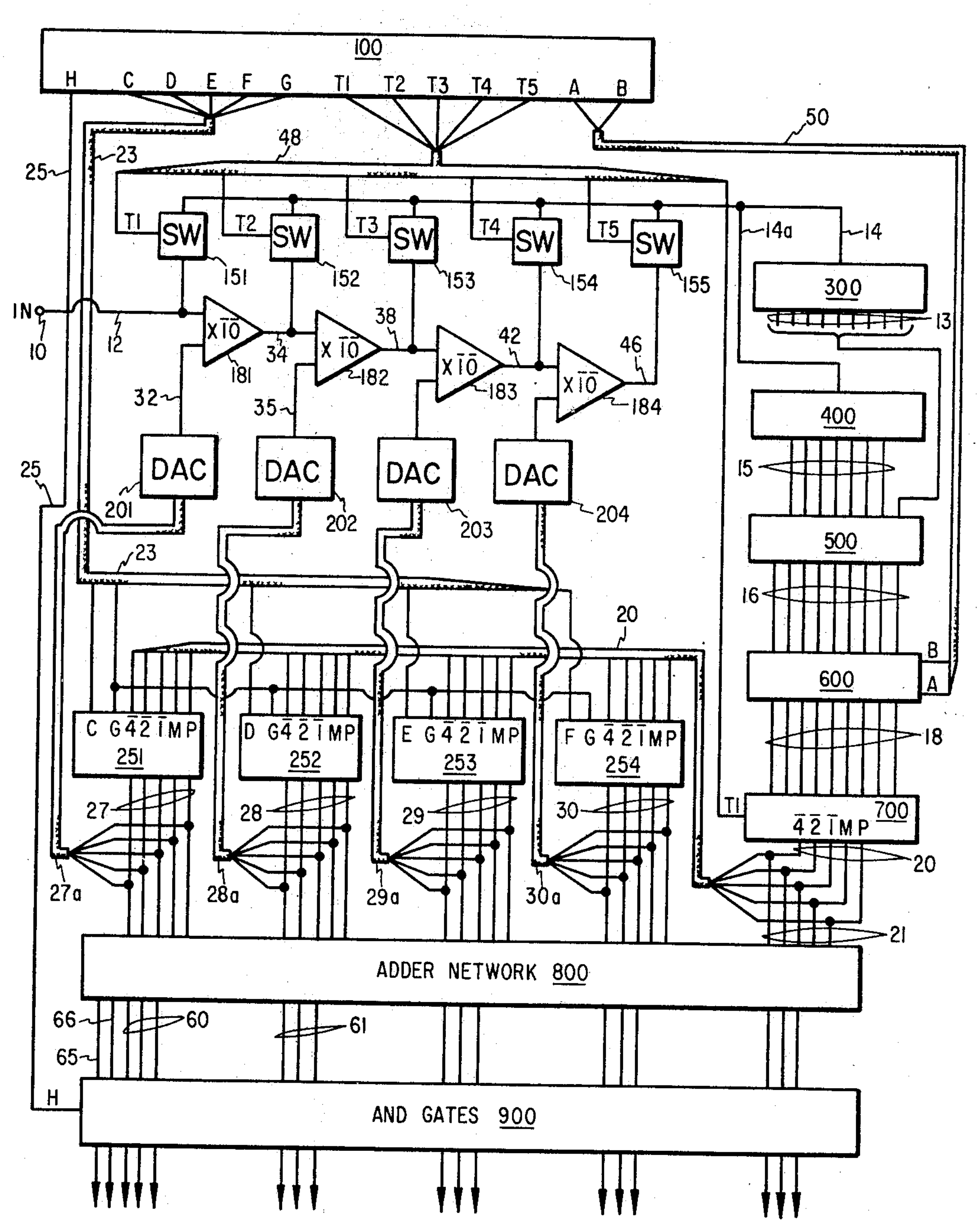
FIG. 1 is a schematic diagram showing the overall conversion circuit of the invention.

With reference to FIG. 1, the overall circuit of the invention is hereinafter described. The embodiment hereinafter described performs digital conversions in the octal system. The octal system employs the eight digits $\overline{0}$, $\overline{1}$, $\overline{2}$, $\overline{3}$, $\overline{4}$, $\overline{5}$, $\overline{6}$ and $\overline{7}$ (the horizontal bars are used to avoid confusion with the similar digit symbols used in decimal notation) and has a radix of $\overline{10}$ (decimal 8). For the sake of consistency and to avoid the cumbersome process of transforming values from octal to decimal and vice versa, all numerical quantities relating to circuit parameters are hereinafter expressed in octal notation. It is believed to be fully within the capabilities of one skilled in the analog conversion art to employ the principles hereinafter taught in performing conversions in the decimal or any other number system.

Analog input terminal 10 is connected to an analog voltage source such as, for example, a sample and hold amplifier which is fed by a time-varying voltage signal to be digitized. A steady-state input voltage is transmitted to the first digit generation stage of the analog to digital converter (ADC) via input line 12. This voltage is applied in parallel to the input terminal of a first analog switch 151 and to a first input port of a non-inverting, subtracting amplifier 181 having a gain of $\overline{10}$. The output line 34 of amplifier 181 is connected to the first input port of a second stage subtracting amplifier 182 also having a gain of $\overline{10}$. Likewise, the output line 38 from amplifier 182 is connected to the first input port of third stage times $\overline{10}$ subtracting amplifier 183, and the output line 42 of amplifier 183 is connected to the first input port of fourth stage times $\overline{10}$ subtracting amplifier 184 having an output line 46. Second, third, fourth and fifth digit stage analog switches 152, 153, 154 and 155, respectively, have their input terminals connected to amplifier output lines 34, 38, 42 and 46, respectively. The output terminals of the five analog switches are connected to a common signal line 14 which is the input for a bank of positive comparator circuits 300 and via the additional line **14*a*, for a bank of negative comparator circuits 400. The input switches are controlled by timing pulses issuing on bus 48 from a timing circuit 100**.

The comparator circuit 300 comprises nine threshold circuits (differential amplifiers) each having a different voltage reference level. For simplicity of description, it is herein assumed that the input range of the ADC circuit is $\overline{20}$ volts, i.e., the analog input signal at terminal 10 never exceeds $+\overline{7}.\overline{7777}^{+}$ volts and never falls below $-\overline{7}.\overline{7777}^{-}$ volts. The nine threshold circuits in the bank 300 are referenced to the respective voltage levels of $\overline{0}$ volts, $\overline{1}$ volt, $\overline{2}$ volts, $\overline{3}$ volts, $\overline{4}$ volts, $\overline{5}$ volts, $\overline{6}$ volts, $\overline{7}$ volts and $\overline{10}$ volts. Negative comparator bank 400 comprises seven threshold circuits referenced to the respective voltage levels of $-\overline{1}$ volt, $-\overline{2}$ volts, $-\overline{3}$ volts, $-\overline{4}$ volts, $-\overline{5}$ volts, $-\overline{6}$ volts and $-\overline{7}$ volts. It is, of course, understood that any desired bipolar voltage range and corresponding threshold levels may in actuality be employed. As will be hereinafter explained in detail, all threshold circuits of the circuit 300 which are referenced to a voltage level substantially equal to or below the level of the signal on input line 14 produce a positive level output signal. Those threshold circuits referenced to a voltage level higher than that on input line 14 produce no output signal. All threshold circuits of the circuit 400 which are referenced to a voltage level more positive (algebraically) than the level of the signal on input line 14*a* produce a positive level output signal while those negative threshold circuits referenced to a voltage level substantially equal to or more negative than that on input line 14*a* produce no output signal.

Threshold circuit output signals issuing from comparator banks 300 and 400 in response to an analog signal on lines 14 and **14*a* are fed via output lines 13 and 15 to a comparator mix circuit 500 where outputs from the two comparator banks which are mutually exclusive are channeled through OR circuits onto a single one of the output lines 16. The signals on the nine lines 16 are entered into a comparator register 600 where they are temporarily stored. The digital signals so stored appear on the nine output lines 18 of the register 600 as "1" or "0" voltage levels and are applied to an encoding circuit 700**.

Circuit 700 converts the signal pattern appearing on the lines 18 to a single BCO digit representing, in the case of a positive input on the lines 14 and **14*a*, the magnitude of the voltage reference level to which the actuated positive threshold circuit having the highest reference level is tied. In the case of a negative input occurring on lines 14 and 14*a* during the first digit generation period, circuit 700 converts the signal pattern appearing on the lines 18 to a single BCO digit which is the seven's complement of the true first conversion digit and in addition produces a 1-level "M" bit indicating the negative polarity of the input signal. Further, during the first digit generation period, the circuit 700 is adapted to generate a "P" bit which is an indication that the input signal exceeds the maximum positive range of the converter. During digit generation periods subsequent to the first, the circuit 700** operates on a unipolar basis and the "M" and "P" bits generated thereby represent correction information employed, in accord with the principles of the aforementioned copending patent application Ser. No. 474,255, filed July 23, 1965, to correct the digital output resulting from an erroneous comparison having occurred during the first digit generation period. The same "M" and "P" bits are utilized in accord with the present invention to correct the erroneous sign indication which may also result from an initial incorrect comparison.

The output from encode circuit 700 consists of three bits of BCO information plus the "M" and "P" bits appearing on the five output lines 20. The numerical significance attached to the BCO signals on the "$\overline{4}$," "$\overline{2}$" and "$\overline{1}$" lines 20 is $\overline{4}$, $\overline{2}$ and $\overline{1}$ in accordance with binary convention. The outputs on the "M" and "P" lines are mutually exlusive.

The signals on the five-wire bus 20 are transmitted to four DAC storage registers 251, 252, 253 and 254. Each of these storage registers includes a five-position binary storage circuit. Also included in each register are means for selectively gating the signals on the bus 20 into selected ones of the registers in response to timing signals applied by circuit 100 via bus 23. BCO and sign-overflow information stored in the register 251 and BCO and correction information stored in the registers 252, 253 and 254 are transmitted via the register output lines 27, 28, 29 and 30 both to an adder network 800 and to a plurality of digital to analog conversion (DAC) circuits 201, 202, 203 and 204, respectively.

As will be subsequently explained in detail, the adder network responds to the BCO, sign, overflow and correction bits stored in the DAC registers to transfer corrected sign and BCO digit representations to output AND gates 900. The DAC circuits cooperate with their associated subtracting amplifiers in a manner hereinafter described in detail to produce a signal at the amplifier output which is $\overline{10}$ times the difference between the magnitude of the signal fed to the amplifier from the preceding stage (or input) and the magnitude of a voltage level which is proportional to the BCO number represented by the digits stored in the DAC register associated with the particular amplifier.

When a BCO digit is stored in any of the DAC registers 252, 253 or 254 without a correction bit accompanying it, the voltage level represented to the corresponding amplifiers 182, 183 or 184 by the associated DAC circuit 202, 203 or 204 is directly proportional to the stored BCO digit. When a correction bit accompanies the BCO digit, the voltage level presented to the amplifier is one of two predetermined correction levels depending upon whether the correction bit is an M bit or a P bit.

As previously mentioned, encode circuit 700 has a different mode of operation during the first digit generation period than in subsequent periods. This is to take into account the fact that, in order to implement the heretofore expressed principles of the invention, it is necessary that the first digit generation comparison be made on a bipolar basis. Because of this, DAC circuit 201 is capable of bipolar operation in a range from $+\overline{10}$ volts to $-\overline{10}$ volts. As previously mentioned, the M bit generated by circuit 700 during the first digit period is a sign rather than a correction bit. Thus, a 0 M bit indicates that the polarity of the input signal on lines 14 and **14*a* was detected to be positive and a 1 M bit indicates a negative polarity. For positive digits stored in DAC register 251, DAC circuit 201 operates in exactly the same manner as DAC circuits 202, 203 and 204, i.e., it represents to the subtracting amplifier 181 a positive voltage level having a magnitude proportional to the BCO digit stored in the DAC register when no P correction bit is present and equivalent to a $+\overline{10}$ volt level when a P correction bit is present. However, when the digit stored in DAC register 251 is negative (accompanied by a 1-level M bit) the circuit 201 represents to subtracting amplifier 181 a negative voltage level which has a magnitude equivalent to the $\overline{10}$'s complement of the BCO digit stored in the register 251. The absolute magnitude of the voltage level represented by the circuit 201 in response to a negative input signal is therefore proportional to the complement of the digit stored in register 251. That is to say, for the digits of $\overline{7}$, $\overline{6}$, $\overline{5}$, $\overline{4}$, $\overline{3}$, $\overline{2}$, $\overline{1}$ and $\overline{0}$ stored in register 251 along with a 1-level M bit DAC circuit 201 is switched to represent negative analog voltages having values of $-\overline{1}$ volt, $-\overline{2}$ volts, $-\overline{3}$ volts, $-\overline{4}$ volts, $-\overline{5}$ volts, $-\overline{6}$ volts, $-\overline{7}$ volts and $-\overline{10}$ volts, respectively. The effect of amplifier 181's subtracting these negative levels from the original negative analog input signal is to produce a positive difference signal on line 34 having a magnitude which is complementary to the magnitude of the difference signal which would be generated on line 34** by a positive analog input signal of the same magnitude. The conversion is thereafter completed on a unipolar (positive) basis.

At the end of a five-digit conversion cycle, the corrected sign and BCO signals appearing at the outputs of adder network 800 are gated to desired utilization circuits through the output AND gates 900 by a pulse issuing on line 25 from circuit 100.

Overall circuit operation assuming a positive input signal and no comparator error With reference now to FIGS. 1 and 3, a description is hereinafter given of the operation of the circuit of FIG. 1 in performing a five digit conversion of an analog input signal having a magnitude equal to $+\overline{0}.\overline{0246}$ volt. For the purposes of this portion of the description it is assumed that the threshold circuits in the comparator banks make correct decisions during each digit generation period.

At the beginning of the cycle, timing pulse 100 supplies a pulse T1 over multi-wire bus 48 to close the switch 151, transferring the analog input signal on line 12 to comparator input line 14. The $+\overline{0}.\overline{0246}$ v. analog signal thus presented to the comparator banks 300 and 400 actuates the one threshold circuit in the bank 300 referenced to the $\overline{0}$ volt reference level and does not actuate any of the threshold circuits in the bank 400. This produces an output signal on one of the nine output lines 16 from comparator mix circuit 500. Immediately after switch 151 closes and during the time that its output is settling to a reasonably steady state, negative-going pulses A and G are issued from timing circuit 100 over multi-wire buses 50 and 23, respectively, to reset the comparator register 600 and the DAC registers 251, 252, 253 and 254. Next a positive-going pulse B is issued over bus 50 to gate the signals on output lines 16 from the circuit 500 into the comparator register 600.

It is to be noted that the gating pulse B does not appear until near the end of the interval of pulse T1. This allows a maximum amount of time for the transient effect generated on lines 14 and 14*a* due to the closing of switch 151 to settle out. As soon as the comparator register has been loaded in response to pulse B and the output signals on the lines 16, encode circuit 700 generates 0 level signals on all output lines 20, representing the positive BCO digit 0. The sign and BCO signals thus present on the lines 20 are transmitted to the inputs of DAC register 251 and a gating pulse C issues over bus 23 to enter them into the register. The digit and sign indications thus stored in register 251 represent the magnitude of the most significant digit and the sign of the output and their presence in the register signifies the completion of the first digit generation period.

As soon as digit signals are available on output lines 27 from the register 251, they are presented to the inputs of DAC circuit 201 via the multi-wire bus 27*a*. These digital inputs into the circuit 201 precisely alter the voltage presented to the amplifier 181 by DAC circuit 201 such that by superposition an output is produced from the amplifier having a magnitude which is $\overline{10}$ times the difference between the magnitude of the signal on line 12 ($\overline{0}.\overline{0246}$ volt) and the magnitude of the voltage level ($\overline{0}$ volts) represented by the BCO digit stored in DAC register 251. The magnitude of the signal on line 34 is therefore $+\overline{0}.\overline{246}$ volt. At substantially the same time the output signals became available on lines 27 from DAC register 251, timing pulse T1 terminated and pulse T2 was initiated to begin the second digit generation period. Signal transients caused by the activation of the switches and resistors in DAC circuit 201, by the change in inputs to amplifier 181, by the opening of switch 151 and the closing of switch 152 are thus all substantially simultaneously initiated and allowed to settle during substantially the same time period. This conserves circuit time and avoids the situation in which subsequent circuit elements cannot be activated with accuracy until prior elements have settled out.

The new signal on comparator input lines 14 and 14*a* ($\overline{0}.\overline{246}$ volts) actuates the threshold circuit in positive comparator bank 300 referenced to the $\overline{0}$ volt level. As during the preceding digit period, none of the threshold circuits in negative comparator bank 400 are actuated. Again, this produces an output signal on only one of the output lines 16 from the circuit 500. During the time in which the new signal on lines 14 and 14*a* was stabilizing and the threshold circuits in the comparator banks were settling out, a second A pulse issued on timing bus 50 to reset comparator register 600. A second B pulse then issues on timing bus 50 to load the stabilized signals on output lines 16 into the comparator register.

Th ensuing presence of a "1" signal on only one of the output lines 18 from the register 600 causes encode circuit 700 to again issue zero signals on all of its output lines 20 to signify the positive BCO digit $\overline{0}$. This BCO signal, representing the second most significant output digit, is transmitted via the bus 20 to the inputs of DAC register 252 whereupon it is caused to be stored therein by a gating pulse B which issues on bus 23. The presence of this output digit on the output lines 28 of register 252 signifies completion of the second digit generation period and activates the inputs, via bus 28*a*, of DAC circuit 202. The digital inputs into DAC 202 precisely alter the voltage presented to the amplifier by DAC 202 such that by superpositon an output is produced from the amplifier having a magnitude which is $\overline{10}$ times the difference between the magnitude of the signal on line 34 ($\overline{0}.\overline{246}$ volts) and the magnitude of the voltage level ($\overline{0}$ volts) represented by the BCO digits stored in register 252. The magnitude of the signal on line 38 is therefore $\overline{2}.\overline{46}$ volts. At substantially the same time the output signals became available on lines 28 from DAC register 252, timing pulse T2 terminated and pulse T3 was initiated to begin the third digit generation period.

As the transients due to activation of the circuits 202, 182, 152 and 153 are settling and the line 14 is approaching its new voltage level of $\overline{2}.\overline{46}$ volts, a third A pulse issues on timing bus 50 to reset comparator register 600. The new voltage level on the lines 14 and 14*a* actuates the three threshold circuits in positive comparator bank 300 referenced, respectively, to the $\overline{0}$ volt, $\overline{1}$ volt and $\overline{2}$ volt levels and does not actuate any of the threshold circuits in negative comparator bank 400. This combination of comparator outputs causes three of the output lines 16 from comparator mix circuit 500 to transmit 1 level signals to the inputs of comparator register 600. Thereupon a third B pulse gates this new pattern or threshold output signals into the register 600, setting up output signal on three of the lines 18. Encode circuit 700 responds with a single output signal on its "$\overline{2}$" output line representative of the magnitude ($\overline{2}$) of the third most significant output digit. This signal is gated into DAC register 253 by timing pulse E causing modification of the inputs to DAC 203 via the multi-wire bus 29*a*. An output voltage on line 42 of $\overline{4}.\overline{6}$ volts is obtained from amplifier 183 in the same manner as previously described in connection with amplifiers 181 and 182. At this time the timing pulses T3 and T4 terminate and initiate, respectively, to begin the fourth digit generation period.

Thereafter, comparator register 600 is reset by a fourth A pulse and the comparator input lines 14 and 14*a* receive, after transients due to activation of the circuits 203, 183, 153 and 154 have settled, the new voltage level equal to $\overline{4}.\overline{6}$ volts. This causes the five threshold circuits in positive comparator bank 300 referenced, respectively, to the $\overline{0}$ volt, $\overline{1}$ volt, $\overline{2}$ volt, $\overline{3}$ volt and $\overline{4}$ volt levels to transmit 1 level output signals while the outputs of the remaining threshold circuits in banks 300 and 400 remain at the 0 level. Five of the lines 16 thus transmit signals to the register 600 and, after a fourth B pulse has gated these signals into the register, encode circuit 700 issues signals on its output lines 20 representative of the digit $\overline{4}$ which is the fourth most significant output digit. This BCO digit is gated into DAC register 254 by gating pulse F transmitted from timing circuit 100 via bus 23 causing the activation of DAC 204 whereby a voltage having a magnitude of $\overline{6}.\overline{0}$ volts is generated on line 46 from amplifier 184 in a manner previously described in connection with amplifiers 181 and 182.

Thereafter, pulse T4 terminates and T5 is initiated to begin the fifth and final digit generation period. After a fifth A pulse has reset comparator register 600 and the transients due to the activation of the circuits 204, 184, 154 and 155 have settled, the new voltage level equal to $\overline{6}.\overline{0}$ volts appears on lines 14 and 14*a*. A fifth B pulse then gates the new signal pattern appearing on lines 16 into the register 600, causing seven of the lines 18 to produce output signals. Encode circuit 700 thereafter responds with signals on its "$\overline{4}$" and "$\overline{2}$" output lines 20 representing the final digit $\overline{6}$, which signals are transmitted by lines 21 to the adder network 800. Since all comparisons were performed correctly by the circuits 300 and 400, the five BCO output digits $\overline{0}$, $\overline{0}$, $\overline{2}$, $\overline{4}$ and $\overline{6}$ appearing respectively on the lines 27, 28, 29, 30 and 21 and the sign bit appearing on M line 27 pass through the adder network 800 without change and are presented to the output AND gates 900. Just prior to the occurrence of the initial A and G reset pulses of the ensuing digit conversion cycle, a pulse H issues from circuit 100 on line 25 to activate all the AND gates 900, thereby transferring the digital and sign output from the adder network to any desired external utilization circuits (not shown). Thereafter, a new analog input voltage is presented on input terminal 10 and another five-digit conversion is performed as above described.

Circuit operation assuming a negative input and no comparator error

Assume now that the analog input voltage present on terminal 10 has a magnitude equal to $-\overline{0}.\overline{0246}$ volts. For the purposes of this portion of the description wherein normal operation of the circuit in converting a negative input voltage is illustrated, it is again assumed that the threshold circuits in comparator banks 300 and 400 make correct decisions during each digit generation period.

During the time interval of pulse T1, switch 151 presents the $-\overline{0}.\overline{0246}$ volt analog input signal to comparator banks 300 and 400 via the lines 14 and 14*a*. Since the magnitude of the signal is between $\overline{0}$ and $-\overline{1}$ volts, no threshold circuits in either the bank 300 or the bank 400 are actuated. Output lines 18 from comparator register 600 are therefore all at the 0 level after the all-zero firing pattern has been gated into the register 600 by the first B pulse. In response to this input, encode circuit 700 generates 1 level output signals on its $\overline{4}$, $\overline{2}$, $\overline{1}$ and M output lines 20 and a 0 level signal on its P output line. The M signal denotes a negative polarity and the BCO $\overline{7}$ denoted by the signals on the $\overline{4}$, $\overline{2}$, and $\overline{1}$ output lines is the seven's complement of the true first conversion digit ($\overline{0}$).

This combination of output signals from encode circircuit 700 is gated into DAC register 251 by the C pulse and effects through output lines 27 and feedback lines 27*a*, the switching of the inputs to the DAC circuit 201 in such a manner to cause that circuit to represent to subtracting amplifier 181 a $-\overline{1}$ volt level. The absolute magnitude ($\overline{1}$) of this level is the $\overline{10}$'s complement of the BCO digit ($\overline{7}$) stored in the register 251. The output from amplifier 181 appearing on line 34 is an analog signal having a magnitude $\overline{10}$ times the difference between the original analog input signal on line 12 ($-\overline{0}.\overline{0246}$ volts) and the negative level represented by DAC 201. The difference or error signal thus generated by the amplifier 181 has a magnitude of $+\overline{7}.\overline{532}$ volts. It is noted that the magnitude of this signal is the $\overline{10}$'s complement of the magnitude of the signal ($\overline{0}.\overline{246}$ volts) that would have been generated on line 34 had the original analog input been positive with the same magnitude (see preceding example).

During the time interval of pulse T2, switch 152 presents the $+\overline{7}.\overline{532}$ volt analog signal on line 34 to the comparator banks 300 and 400 to initiate the second digit generation period. Operation of the comparator circuits 300 and the encode circuit during T2 results in generation of a BCO $\overline{7}$ as the second most significant output digit, which is stored by timing pulse D in DAC register 252. The conversion cycle continues in the manner hereinbefore described for the case of a positive analog input signal and third, fourth and fifth output digits representing, respectively, $\overline{5}$, $\overline{3}$ and $\overline{2}$ are generated and stored in DAC registers 253, 254 and comparator register 600, respectively. Inasmuch as all comparison decisions were performed correctly, the output digits are transferred through adder network 800 unchanged and appear, in response to output gating pulse H, at the outputs of AND gates 900 as the BCO digits $\overline{77532}$ accompanied by a minus (1 level) sign bit transferred by output line 66 from adder network 800. It is to be noted that this output expressed in BCO, which is the way it actually appears at the outputs of AND gates 900, is 111 111 101 011 010. This quantity is the binary two's complement of the quantity 000000010100110 which is a pure binary expression of the magnitude ($\overline{00246}$) of the input signal. The converter of the invention therefore directly produces binary outputs wherein quantities having the same magnitude but opposite sign are represnted by numbers which are the binary two's complement of one another. This allows the converter to be employed directly in any data processing system which employs this common scheme of sign notation.

Circuit operation assuming an incorrect initial comparator decision

As previously stated, the present invention extends the error correction principles of the unipolar analog to digital converter disclosed in the aforementioned co-pending patent application to provide correction of erroneous sign as well as digit indications resulting from an incorrect comparator decision during the first digit generation period. The operation of the circuit of the invention in correcting erroneous comparator decisions which do not affect the signal of the output is not herein described in detail since such operation is by and large the same as that described in the aforementioned co-pending patent application.

There are two types of incorrect decisions that a threshold circuit in a comparator bank can make. These two types of "misfires" are herein termed "malfires" and "nonfires." The former type of misfire is caused when a threshold circuit fires when it should not have fired and the latter is caused when a threshold circuit does not fire when it should have fired. To illustrate the occurrence of a malfire, assume that the analog input signal is, as in the second illustration above, $-\overline{0}.\overline{0246}$ volts. This is very close to being a positive quantity and the threshold circuit in comparator bank 300 which is referenced to a $\overline{0}$ volt potential, in malfiring because of static inaccuracies in its own circuit, misinterprets this input voltage as being equal to or above $\overline{0}$ volts and produces an erroneous output signal. The circuit could also malfire if the input presented to its was actually equal to or above $\overline{0}$ volts due to error in the analog switch 151 or in the circuits preceding input line 12. Such a comparator malfire sets up an "underflow" condition in the converter which initiates a first correction procedure, to be subsequently described in detail, resulting in the subsequent transfer of correct sign and output digits in place of the erroneous ones initially produced as a result of the comparator malfire.

To illustrate a comparator nonfire, assume that the magnitude of the analog input signal is $+\overline{0}.\overline{0246}$ volts. The $\overline{0}$ volt threshold circuit in comparator bank 300, in nonfiring because of static inaccuracies in its own circuit, misinterprets this voltage as being less than $\overline{0}$ volts and this does not fire. Such a nonfire could also be caused by error in the digit stage switch 151 or in a circuit preceding it resulting in a comparator input which is actually below $\overline{0}$ volts. When an incorrect decisions of this type is made, an "overflow" condition results in the converter which initiates a second correction procedure.

Referring now to FIG. 1, the two above-mentioned correction procedures are hereinafter described in terms of specific examples. As mentioned above in describing a comparator malfire, which initiates the "underflow" correction procedure, the $-\overline{0}.\overline{0246}$ volt input signal improperly causes the $\overline{0}$ volt threshold circuit in comparator bank 300 to fire during the first digit generation period. The firing pattern thus generated by the comparator banks and presented to encode circuit 700 on the lines 18 makes it appear as though the input signal were between $\overline{0}$ and $+\overline{1}$ volt, resulting in the generation of 0 level output signals on all of the lines 20. As mentioned during the preceding discussions, this combination of signals denotes to DAC circuit 201 a positive BCO level of $\overline{0}$ volts. Amplifier 181, in subtracting this level from the actual input signal and multiplying the difference times $\overline{10}$, generates an output signal on line 34 having a magnitude of $-\overline{0}.\overline{246}$ volts. When this negative level is presented by switch 152 to the comparator banks during the second digit generation period, none of the threshold circuits there are actuated and no output signal appears on the lines 16. The second B pulse to comparator register 600 therefore does not gate any 1 level signals into the register 600 and the output lines 18 therefrom all remain at the 0 level.

The all-zero input thus transmitted to encode circuit 700 causes the encoding logic therein to set up 0 output signals on the $\overline{4}$, $\overline{2}$, $\overline{1}$ and P output lines 20 and a $\overline{1}$ signal on the M output line. As brought out in the preceding discussions, this same combination of input signals into circuit 700 during the first digit generation period would cause a 11110 signal group to appear on the $\overline{4}$, $\overline{2}$, $\overline{1}$, M and P output lines 20 denoting a bona fide negative input. However, because all digit stages after the first operate on a unipolar basis, this negative level input signal constitutes an "out of range" signal which is an indication that an incorrect comparator decision was made during the preceding digit period. Timing pulse D gates the 00010 combination of output signals into DAC register 252, causing the same signals to appear on output lines 28. These signals, when fed to DAC 202 via the bus *28a* cause the circuits therein to represent to amplifier 182 a predetermined underflow correction level equivalent to $-\overline{1}$ volt via line 32. This minus level when subtracted from the negative analog input signal on line 34 results in an output signal on line 38 having a magnitude equal to $+\overline{5}.\overline{32}$ volts. The magnitude of this signal is exactly the same as it would have been had the $\overline{0}$ volt threshold circuit in comparator bank 300 not malfired during the first digit generation period. The analog signal has thus been corrected and the conversion proceeds through the third, fourth and fifth digit generation periods in exactly the same manner as above described for the positive input, no-error case.

The BCO $\overline{0}$ which is represented by the $\overline{4}$, $\overline{2}$ and $\overline{1}$ outputs from the register 252 is, due to the presence of the M correction bit, altered in being transferred through the adder network 800 and appears as a BCO $\overline{7}$ on output lines 61. Also, the M correction bit causes the BCO $\overline{0}$ represented on the $\overline{4}$, $\overline{2}$ and $\overline{1}$ output lines from DAC register 251 to be changed by the adder network so that the digital output represented on the output lines 60 is a BCO $\overline{7}$. Further, the correction bit causes a 1 level signal, signifying a minus, to be transmitted on output line 66 from the adder network in place of the erroneous plus indication appearing on the M output line 27 from DAC register 251. The M correction bit generated during the second digit generation period therefore causes correction of the sign and magnitude representations of the digital output.

To provide an example of the analog and digital correction operation which is performed in the event of an overflow condition initiated by a comparator nonfire, it is assumed that the analog input signal on input line 12 has a magnitude of $+\overline{0}.\overline{0246}$ volt. In this instance an overflow condition would be caused by nonfiring of the $\overline{0}$ volt threshold circuit in comparator bank 300. In this event none of the comparator threshold circuits fire and no 1 level input signals are transmitted to encode circuit 700 during the first digit generation period. The encode circuit output is therefore 11110 as if the actual analog input were less than $\overline{0}$ volts but not less than $-\overline{1}$ volt. This output represents a BCO $\overline{7}$ with a minus sign bit. When this combination of signals is presented to the inputs of DAC circuit 201, the ensuing voltage level represented to amplifier 181 thereby is $-\overline{1}$ volt, as previously discussed in the negative input, no error example. The difference or error signal produced by amplifier 181 in response to this input from circuit 201 has a magnitude of $+\overline{10}.\overline{246}$ volts. This signal, appearing on line 34, is presented to the comparator banks through switch 152 during the second digit generation period and actuates all nine of the comparator threshold circuits of the positive comparator bank 300 and actuates none of the negative threshold circuits of the bank 400. This produces output signals on all nine of the output lines 16 from comparator mix circuit 500, which firing pattern is encoded by circuit 700 to represent the signal combination of 11101 on output lines 20. This combination of signals is stored in DAC register 252 in response to timing pulse D and thereafter appears on output lines 28 to be presented both to DAC circuit 202 and to the adder network 800. The circuit 202, when it receives the $\overline{4}$, $\overline{2}$, $\overline{1}$ and P input signals, causes a predetermined overflow correction level equivalent to $+\overline{10}$ volts to be presented to the amplifier 182 via line 35. The output from amplifier 182 is thus an analog signal having a magnitude of $\overline{2}.\overline{46}$ volts. This is exactly the same signal level that would have been generated by amplifier 182 had the $\overline{0}$ volt threshold circuit in comparator bank 300 fired correctly in the first instance. In addition, the adder network 800 responds to the P correction bit stored in DAC register 252 to transfer to output AND gates 900 on lines 61 signals representative of a BCO $\overline{0}$ rather than the BCO $\overline{7}$ represented by the outputs from DAC register 252. Also, the correction bit causes adder network 800 to transfer a BCO $\overline{0}$ and a plus sign indication to the AND gates 900 via lines 60 and 66 rather than the erroneous BCO $\overline{7}$ and minus sign indications stored in DAC register 251. The remaining three digit generation periods are completed in the manner previously described for the positive input, no-error case.

In both of the above-described error correction procedures, erroneous comparison decisions were made during the first digit generation period as a result of incorrect operation of the $\overline{0}$ threshold circuit in comparator bank 300. Incorrect decisions may possibly be made by any of the threshold circuits in the comparator bank, but inasmuch as erroneous operation of threshold circuits other than that referenced to the $\overline{0}$ volt potential do not affect the sign of the digital output, examples of such operation are not herein discussed since the principles of such operation are fully described in the aforementioned patent application disclosing error correction in a unipolar converter.

As is apparent from the above descriptions, error correction in the converter of the present invention is based upon the premise that an incorrect comparator decision made during the first digit generation period which results in generation of an erroneous sign and first magnitude digit causes a difference signal to be generated by the first stage subtracting amplifier which is outside the range of voltage levels which could possibly be presented for comparison during the next digit generation period under normal error-free operation. That is to say, under normal operations the range of voltages presented to the comparator banks during the second digit generation period is between $\overline{0}$ and $+\overline{7}.\overline{777}^{+}$ volts. The detection of a voltage level which is outside this range causes initiation of one of the above generally described error correction procedures.

DETAILED CIRCUIT DESCRIPTION

Timing circuit 100

Figure 2:
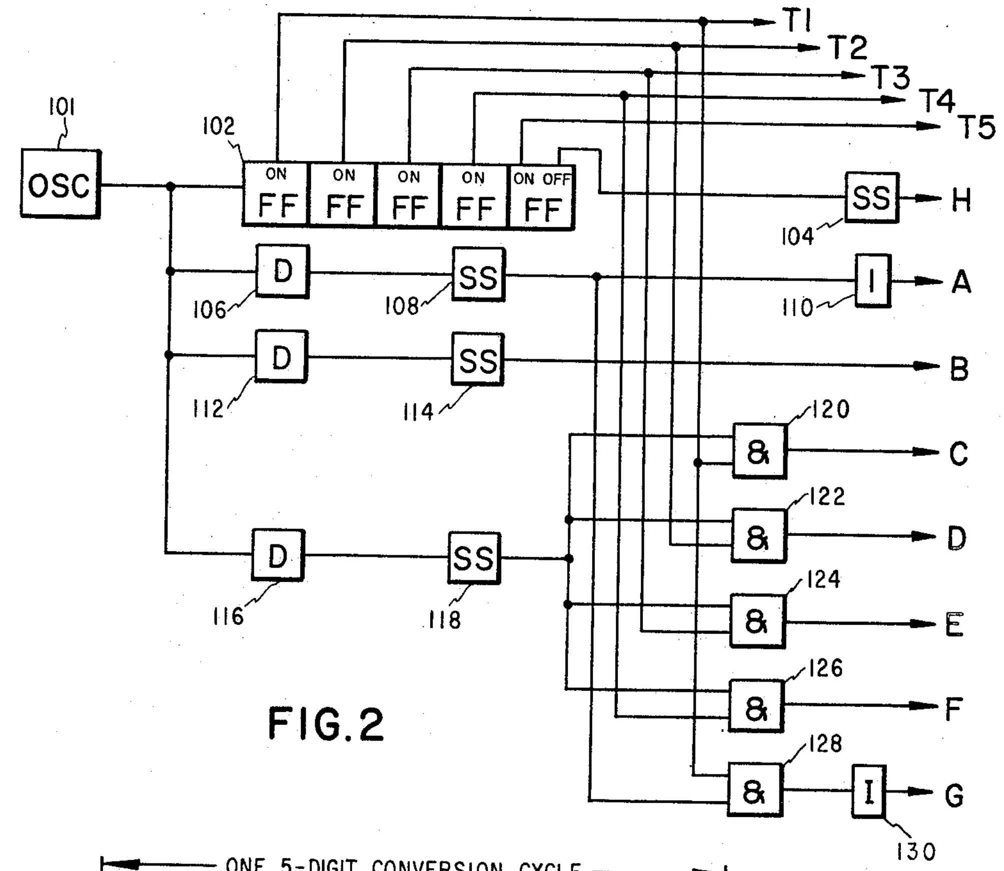
FIG. 2 is a schematic diagram of the timing circuit 100.
Figure 3:
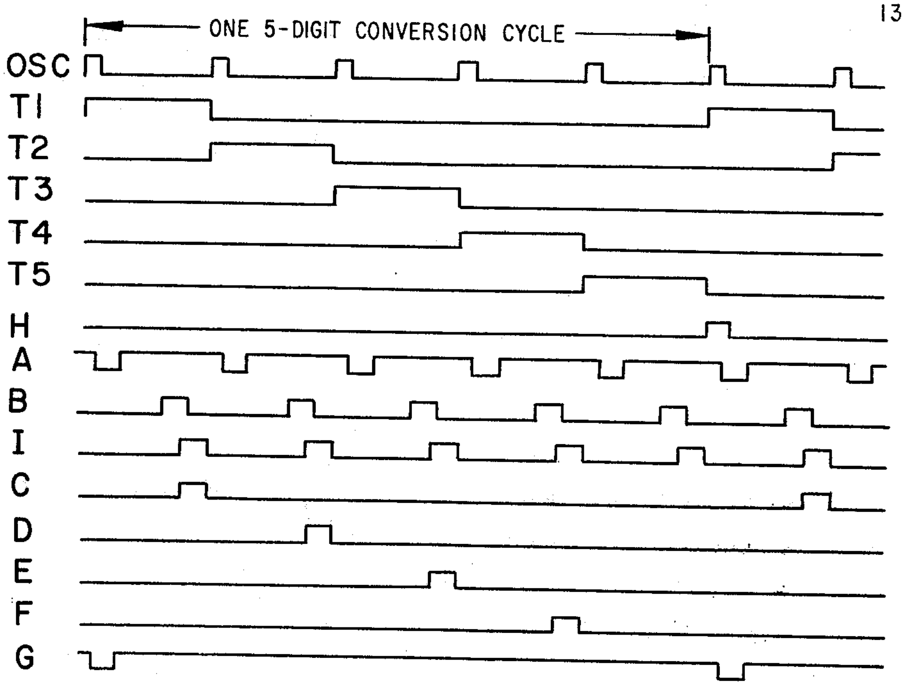
FIG. 3 is a timing diagram illustrating the time relationship between the various output pulses produced by the timing circuit of FIG. 2.

FIG. 2 shows, in schematic form, one embodiment of a circuit which may be employed for the timing circuit 100 of FIG. 1 to produce the various waveforms shown in FIG. 3. An oscillator circuit 101 produces, in a continuous sequence, the output pulses shown at the top of the waveform diagram of FIG. 3. These pulses are fed to the inputs of ring circuit 102 and of delay circuits 106, 112 and 116. The ring circuit 102 comprises a plurality of bistable flip-flops interconnected in a well-known fashion so that only one of the flip-flops can be on at a given time and such that each pulse applied at the input to the ring turns off the flip-flop then on and turns on the next succeeding flip-flop in the ring. The timing pulses T1 through T5 are taken from the responsive "on" outputs of the flip-flops in the ring.

The "off" output of the final flip-flop in the ring is connected to a singleshot multivibrator 104, the output from which supplies the waveform H used to gate the digital output from AND gates 900 at the end of each conversion cycle. Singleshot 104 is triggered only by positive-going transitions and thus produces the pulse H only once per conversion cycle, i.e., when the end flip-flop is turned off at the termination of timing pulse T5. Delay circuit 106 has its output connected to the input of a singleshot multivibrator 108 which in turn is connected to an inverter 110. The output of the latter circuit yields the negative-going A pulses which are used to reset the comparator register 600 immediately following initiation of each of the timing pulses T1–T5. Delay circuit 106 may be any of the various well-known types of delay circuits and provides an amount of delay as indicated in FIG. 3 by the time differential between the leading edge of an oscillator output pulse and the leading edge of the succeeding A pulse.

Delay circuit 112 feeds the input of a singleshot multivibrator 114, the output of which supplies the B pulses which are used to load comparator register 600 during the latter portion of each of the timing intervals T1–T5. The amount of delay provided by the circuit 112 is illustrated in FIG. 3 by the time differential between the leading edge of an oscillator pulse and the leading edge of the succeeding B pulse.

Delay circuit 116 has its output connected to the input of a singleshot multivibrator 118 which produces the waveform I which is transmitted to a first input of each of a plurality of AND circuits 120, 122, 124 and 126. The second input to each of these AND circuits is supplied from the "on" output of each of the first four flip-flops in the ring circuit 102. The output signals generated by AND circuits 120, 122, 124 and 126 are the waveforms C, D, E, and F, respectively, which are used to load the output from encoding circuit 700 into the DAC registers 251, 252, 253 and 254. As can be determined from FIG. 3, the amount of delay required in circuit 116 is proportional to the distance from the leading edge of an oscillator pulse to the leading edge of the succeeding I pulse.

AND circuit 128 produces an output pulse coinciding with the first A pulse of each digit conversion cycle. This pulse is fed to an inverter 130, the output from which supplies the negative-going G pulse used to reset all of the DAC registers at the beginning of each conversion cycle.

Input switches, radix amplifiers and DAC circuits

With reference to FIGS. 4*a* and 5, a detailed description of input switch 151, radix amplifier 181 and digital to analog converter circuit 201 of the first digit generation stage is hereinafter given. It is to be understood that the input switches 152, 153, 154 and 155 are identical in structure and operation to the switch 151 and that the radix amplifiers 182, 183 and 184 are identical to the amplifier 181 and that detailed descriptions of these elements of the ADC is unnecessary. DAC circuits 202, 203 and 204 differ slightly from the circuit 201 and are subsequently explained in detail in connection with FIG. 4*b*.

Input switch 151 (FIG. 4*a*) includes control transistor 156, input transformer 162 and a pair of signal path transistors 158 and 160. Timing pulse T1 is supplied over bus 48 from the timing circuit 100 to the base of transistor 156. The leading, positive-going edge of T1 saturates transistor 156 and causes a current pulse to be drawn through the primary winding of transformer 162. This pulse begins driving the transformer toward its saturation point producing an output voltage across the secondary, which voltage is applied across the base to emitter junctions of both signal path transistors 158 and 160, driving them into saturation. This opens a low impedance analog signal path to transfer the analog input signal on input line 12 to comparator input line 14 through the collector to emitter conduction paths of the transistors 158 and 160.

The bandwidth and duty cycle characteristics of transformer 162 are chosen so that the voltage pulse induced across the secondary is a relatively good reproduction of the input pulse T1. When T1 terminates, transistors 158 and 160 are rapidly driven out of saturation by means of a sharply dropping pulse produced through the conduction path provided by resistor 164. This re-opens the switch 151 to cut off the connection between input line 12 and comparator input line 14.

The radix amplifier 181, shown schematically in FIG. 4*a* and in detail in FIG. 5, is a DC, non-inverting, subtracting amplifier having a fixed gain of $\overline{10}$ from its input port 12 to its output 34. Two conventional gain stages 186 and 187 are interconnected by a double emitter follower 188. An emitter follower 189 transmits the output from the second gain stage 187 to output line 34. A constant current source 190 is used to increase the common mode rejection ratio of the first gain stage 186. A feedback resistor 185 is connected from output line 34 to the second input port 32. The DAC circuit 201, shown in detail in FIG. 4*a*, is also a part of the amplifier feedback circuit and acts in accordance with digital inputs received at its input terminals 222 from DAC register 251 to reduce the signal on line 34 so that it is $\overline{10}$ times the difference between the signal on line 12 and the magnitude of the voltage level represented by the digital signals applied to terminals 222. As previously explained, DAC circuit 201 is bipolar in operation in that it is controlled by inputs from DAC register 251 to represent to the amplifier 181 voltages ranging from $+\overline{10}$ volts to $-\overline{10}$ volts.

DAC circuit 201 includes four resistors 208, 209, 210 and 211 having the respective resistance values of $\overline{5}R/\overline{4}$, $\overline{5}R/\overline{2}$, $\overline{5}$R and $\overline{5}$R in the ratio of $\overline{1}:\overline{2}:\overline{4}:\overline{4}$. One end of each of these resistors is connected to a common junction point 212. The other ends of the resistors are connected to the output terminals of the single pole, double throw (SPDT) switches 215, 224, 226 and 228, respectively. Reference potentials of +E and 0 volts are supplied to the switches via the lines 207 and 227, respectively. Control inputs are supplied to the switches from the DAC input terminals 222 which, as previously mentioned, receive control signals via the $\overline{4}$, $\overline{2}$, $\overline{1}$ and P lines of bus **27*a* from the output lines 27 of DAC register 251**.

The SPDT switches 215, 224, 226 and 228 are identically constructed and only the circuit for switch 215 is shown in detail. The switch includes a pair of control transistors 216 and 217 and a pair of switch transistors 218 and 220. The DAC input signal received on the $\overline{4}$ terminal 222 is transmitted to the base of transistor 216. When a positive-going signal signifiying a 1 bit appears on the line, transistor 216, which is of the NPN type, becomes conducting, causing a negative-going transition to occur at the base of transistor 217. This turns transistor 217 off and causes positive-going transitions to be presented to the bases of both transistors 218 and 220. Since the latter transistors are of the NPN and PNP types, respectively, transistor 218 is rendered conductive and 220 nonconductive. This connects resistor 208 through a low impedance path to the voltage line 207, connecting the voltage +E into the feedback path of amplifier 181 through the resistor 208. When 0 level digit signal is received at the $\overline{4}$ terminal 222, transistor 216 remains nonconductive and the voltage levels at the bases of transistors 218 and 220 stay down, sustaining the former in a nonconducting state and the latter in a conducting state. This connects the $\bar{0}$ volts (ground) of line 227 into the feedback path of amplifier 181 through the resistor 208.

In order to render the DAC circuit 201 capable of bipolar operation, an additional resistor 213 having a resistance value of $\bar{5}R/\overline{10}$ is connected to SPDT switch 230 to provide a full-scale ($\overline{10}$ volts) negative offset when the sign bit M stored in DAC register 251 is a 1. The switch 230 is adapted to apply to the resistor 213 a reference voltage level of −E or ground in accordance with the value of the control signal received on M terminal 222. The switch 230 includes two switch transistors 231 and 232 driven by a PNP control transistor. When a 1 level signal is applied to M terminal 222, transistor 231 is biased into conduction and transistor 232 into nonconduction. This opens a path to apply the −E potential to the resistor 213. When a 0 level signal is received at the M input terminal, transistor 232 is switched into conduction and transistor 231 into nonconduction, applying ground potential to resistor 213.

A shunt resistor 214 having a resistance value of $\bar{5}R/\overline{23}$ is connected from junction point 212 to ground line 227 in order to render the value of the equivalent resistance of the network including $R_{208}$, $R_{209}$, $R_{210}$, $R_{211}$, $R_{213}$ and $R_{214}$ proper for operation in accord with the principles set forth below.

The gain of amplifier 181 from input port 12 to output line 34 is calculated as follows:

$$G=\frac{R_{185}+R_e}{R_e}$$

where $R_e$ equals the equivalent resistance of $R_{208}$, $R_{209}$, $R_{210}$, $R_{211}$, $R_{213}$ and $R_{214}$. Since $$\frac{\bar{1}}{R_e}=\frac{\bar{4}}{\bar{5}R}+\frac{\bar{2}}{\bar{5}R}+\frac{\bar{1}}{\bar{5}R}+\frac{\bar{1}}{\bar{5}R}+\frac{\overline{23}}{\bar{5}R}+\frac{\overline{10}}{\bar{5}R}$$

$R_e$ equals $R/\bar{7}$. Since the value of resistor 185 is equal to R, $$G=\frac{R+\frac{R}{\bar{7}}}{\frac{R}{\bar{7}}}=\overline{10}$$

The output voltage $V_0$ on line 34 under any given set of input conditions may be represented as follows:

$$V_0=\overline{10}V_{in}-R_{185}\left[\frac{X_{215}E}{R_{208}}+\frac{X_{224}E}{R_{209}}+\frac{X_{226}E}{R_{210}}+\frac{X_{228}E}{R_{211}}+\frac{X_{230}(-E)}{R_{213}}\right] \quad (1)$$

where the values of $X_{215}$, $X_{224}$, $X_{226}$, $X_{228}$ and $X_{230}$ are $\bar{1}$ if the control inputs to the respective switches 215, 224, 226, 228 and 230 are 1 and are $\bar{0}$ if the input signals to the respective switches are 0. Thus, for example, if the input voltage on line 12 is equal to $+\bar{5}.\bar{5}$ volts, the digital feedback signals to the input terminals 222 of DAC circuit 201 from the encoding circuit 700 represent (assuming no comparator error) the BCO digit $\bar{5}$ and appear as 1 input signals to the switches 215 and 226. The signal on output line 34 from the amplifier 181 in accordance with Equation 1 is thus:

$$V_0=\overline{10}\times\bar{5}.\bar{5}-R\left(\frac{E}{\frac{\bar{5}R}{\bar{4}}}+\frac{E}{\bar{5}R}\right)=\overline{55}-E$$

With reference voltage E set at a constant $\overline{50}$ volts, the output on line 34 is equal to the required $\bar{5}.\bar{0}$ volts. Taking another example to illustrate the bipolar operation of the DAC circuit 201, if the input on line 12 is $-\bar{5}.\bar{5}$ volts, the control inputs to circuit 201 are 01010 (again assuming no comparator error) and the output of amplifier 181 in accordance with Equation 1 is:

$$V_0=\overline{10}\times(-\bar{5}.\bar{5})-R\left(\frac{\overline{50}}{\frac{\bar{5}R}{\bar{2}}}+\frac{-\overline{50}}{\frac{\bar{5}R}{\overline{10}}}\right)$$

$$=-\overline{55}-R\left(\frac{-\overline{360}}{\bar{5}R}\right)=+\bar{3}.\bar{0}V$$

It is noted that the resultant $\bar{3}$ volt output is, in accord with the previously discussed principles of operation, a positive quantity which is the $\overline{10}$'s complement of the difference signal which would be produced in response to a $+\bar{5}.\bar{5}$ volt input signal.

The second stage DAC circuit 202 is shown in FIG. 4*b*. It is to be understood that the DAC circuits 203 and 204 are identical in structure and operation to the circuits 202 and do not require separate detailed descriptions. As shown in FIG. 4*b*, DAC circuit 202 includes five SPDT switches 240, 241, 242, 243 and 244 which are exactly the same as the five switches 215, 224, 226, 228 and 230 in the circuit 201. The output terminals of these switches are connected to the five resistors 234, 235, 236, 237 and 239, respectively. The opposite end of each of the resistors is connected to the DAC output line 35, which ties the circuit 202 into the feedback path of the radix amplifier 182. The switches are controlled from the terminals 245 which receive the $\bar{4}$, $\bar{2}$, $\bar{1}$, M and P bits stored in DAC register 252. The resistors 234, 235 and 236 have resistance values of $\bar{5}R/\bar{4}$, $\bar{5}R/\bar{2}$ and $\bar{5}$R in the binary ratio of $\bar{1}$:$\bar{2}$:$\bar{4}$. The potentials produced across these resistors are controlled by the $\bar{4}$, $\bar{2}$ and $\bar{1}$ input lines 245 which are activated in different combinations to represent the BCO digits $\bar{0}$ through $\bar{7}$. The resistors 237 and 239 have resistance values of $\bar{5}$R and enable the circuit 202 to develop the proper error correction voltage levels in accordance with signals on the P and M input terminals 245, respectively. A shunt resistor 238 having a resistance value of $\bar{5}R/\overline{32}$ is connected from output line 35 to ground in order to render the value of the equivalent resistance of the network including $R_{234}$, $R_{235}$, $R_{236}$, $R_{237}$, $R_{238}$ and $R_{239}$ proper in order to provide amplifier 182 with a fixed gain of $\overline{10}$ from its first input port 34 to its output 38.

The output voltage $V_0$ on line 38 of amplifier 182 under any given set of input conditions may be represented as follows:

$$V_0=\overline{10}V_{in}-R\left[\frac{X_{240}E}{R_{234}}+\frac{X_{241}E}{R_{235}}+\frac{X_{242}E}{R_{236}}+\frac{X_{243}E}{R_{237}}+\frac{X_{244}(-E)}{R_{239}}\right] \quad (2)$$

where the values of $X_{240}$, $X_{241}$, $X_{242}$, $X_{243}$ and $X_{244}$ are $\bar{1}$ if the control inputs to the respective switches 240, 241, 242, 243 and 244 are 1 and are $\bar{0}$ if the input signals to the respective switches are 0.

To illustrate the operation of the analog signal correction circuits of the invention, assume that the amplifier 182 receives an input of $-\bar{0}.\overline{255}$ volts on line 34 from the first digit stage amplifier 181, signifying the occurrence of a threshold circuit malfire during the first digit generation period. This negative input signal is applied through switch 152 to the comparator banks and causes encode circuit 700 to initiate the underflow correction procedure by issuing a 1 level M signal and 0 level $\bar{4}$, $\bar{2}$, $\bar{1}$ and P signals. When this combination of signals is applied to input terminals 245 of DAC circuit 202, resistors 234, 235, 236 and 237 are grounded by their switches and the resistor 239 is connected to the −E reference potential by the switch 244. The magnitude of the signal thus produced on amplifier output line 38 is calculated in accordance with Equation 2 as follows:

$$V_0=\overline{10}\times\left(-\bar{0}.\overline{255}-R\left(\frac{-\overline{50}}{\bar{5}R}\right)\right.$$

$$=-\bar{2}.\overline{55}-R\left(\frac{-\overline{10}}{R}\right)=+\bar{5}.\overline{23}\text{ volts}$$

The amplifier output of $+\bar{5}.\overline{23}$ volts is thus $\overline{10}$ times the difference between the analog input signal on line 34 and an underflow correction level of $-\bar{1}$ volt, the latter being set up by the application of the M correction signal to DAC 202.

To illustrate the manner in which DAC circuit 202 corrects the analog signal in the case of an overflow, assume that the magnitude of the signal on line 34 from the first digit generation amplifier 181 is $\overline{10}.\overline{255}$ volts resulting from a threshold circuit nonfire occurring during the preceding digit generation period. The combination of input signals presented to the terminals 245 by encode circuit circuit 700 is thus a 0 level M signal and 1 level $\bar{4}$, $\bar{2}$, $\bar{1}$ and P signals. The magnitude of the signal produced on output line 38 from amplifier 182 in response to this combination of inputs is calculated in accordance with Equation 2 as follows:

$$V_0=\overline{10}\times\overline{10}.\overline{255}-R\left(\frac{\frac{\overline{50}}{\bar{5}R}}{\bar{4}}+\frac{\frac{\overline{50}}{\bar{5}R}}{\bar{2}}+\frac{\overline{50}}{\bar{5}R}+\frac{\overline{50}}{\bar{5}R}\right)$$

$$=\overline{102}.\overline{55}-R\left(\frac{\overline{500}}{\bar{5}R}\right)=\bar{2}.\overline{55}\text{ volts}$$

The amplifier output voltage of $\bar{2}.\overline{55}$ volts is thus equivalent to $\overline{10}$ times the magnitude of the difference between the analog signal on line 34 and the $\overline{10}$ volt overflow correction level set up in DAC circuit 202 in response to the 11101 combination of input signals applied to it.

The coaction between the DAC circuits 203 and 204 with their respective subtracting amplifiers 183 and 184 is identical to that just described in connection with the circuits 182 and 202, thus enabling error corrections to be carried out in the circuit of the invention during any digit generation period subsequent to the first.

Positive comparator bank 300

The positive comparator bank 300 is shown in detail in FIG. 6. It comprises a bank of nine threshold circuits (differential amplifiers) 305, 306, 308, 310, 312, 314, 316, 318 and 319. The input to the comparator bank 300 is supplied from line 14 and each threshold circuit receives the signal thereon via a line 304.

Each threshold circuit is connected to a different voltage reference level established by a voltage divider including the resistors 303 connected between the source of reference potential +V and ground. As shown, the threshold circuits 305, 306, 308, 310, 312, 314, 316, 318 and 319 receive reference voltages levels of $\overline{10}$ volts, $\bar{7}$ volts, $\bar{6}$ volts, $\bar{5}$ volts, $\bar{4}$ volts, $\bar{3}$ volts, $\bar{2}$ volts, $\bar{1}$ volt and $\bar{0}$ volts, respectively. Any signal on input line 14 having a magnitude substantially equal to or in excess of the voltage reference level of a given threshold circuit causes that circuit to produce a positive output signal on its respective output line 13.

All threshold circuits are identically constructed and only the details of circuit 305 are shown. The circuit arrangement is that of a simple differential amplifier having input transistors 320 and 322, a control transistor 326 and an output transistor 324. When the signal on line 304 has a magnitude below $\overline{10}$ volts, transistors 320 and 322 are biased into non-conducting and conducting states, respectively. This sustains both the transistors 324 and 326 in non-conduction and output line 13*a* is maintained at a minus level established by the bias potential applied at terminal 328. When the signal on line 304 is raised above $\overline{10}$ volts, the states of transistors 320, 322, 324 and 326 are reversed and a positive-going output "1" signal is produced on line 13*a*. The remaining threshold circuits 306, 308, 310, 312, 314, 316, 318 and 319 operate in an identical fashion except that they are actuated to produce output signals in accord with their respective different threshold levels.

Negative comparator bank 400

The negative comparator bank 400 is shown in detail in FIG. 7. It comprises seven differential amplifier circuits 405, 406, 408, 410, 412, 414 and 416 of the type described above in connection with positive comparator bank 300. The input to the bank 400 is supplied from line 14*a* and each threshold circuit receives the signal thereon via a line 404. Each threshold circuit is connected to a different voltage reference level established by a voltage divider including the resistors 404 connected between the source of reference potential —V and ground. As shown, the threshold circuit 405, 406, 408, 410, 412, 414 and 416 receive reference voltage levels of $-\bar{7}$ volts, $-\bar{6}$ volts, $-\bar{5}$ volts, $-\bar{4}$ volts, $-\bar{3}$ volts, $-\bar{2}$ volts and $-\bar{1}$ volt, respectively. Any signal on input line 14*a* having a magnitude more negative than that of the voltage reference level of a given threshold circuit causes that circuit to produce a positive output signal on its respective output line 15. As is noted by comparison with the circuit details of threshold circuit 305 of FIG. 6, this result is obtained by reversing the input leads such that input transistor 422 of the circuit 405 receives at its base the comparator bank input signal on line 404 while the input transistor 420 receives the reference voltage at its base. Thus, whenever the signal on line 404 has a magnitude substantially equal to or more positive than $-\bar{7}$ volts, transistors 420 and 422 are biased into nonconducting and conducting states, respectively. This causes output line 15*b* to be maintained at the "0" output level. When the signal on line 404 is made more negative than $-\bar{7}$ volts, the states of the transistors 420 and 422 are reversed and a positive-going "1" signal is produced on the line 15*b*. The remaining threshold circuits 406, 408, 410, 412, 414 and 416 operate in an identical fashion except that they are actuated to produce output signals in accord with their respective different negative threshold levels.

Comparator mix circuit 500, comparator register 600 and encode circuit 700

Circuit details of the comparator mix circuit 500, comparator register 600 and encode circuit 700 are shown in FIG. 8*a*. The mix circuit 500 takes the sixteen outputs from the comparator banks 300 and 400 and condenses them to nine outputs on the lines 16*a* through 16*i*. This is possible since the outputs from threshold circuits in the positive and negative comparator banks which have reference potentials of equal magnitude but opposite sign are mutually exclusive, i.e., when, for example, threshold circuit 318, which is referenced to a $+\bar{1}$ volt level, fires, threshold circuit 416, which is referenced to a $-\bar{1}$ volt level, cannot fire and vice versa. Thus, OR circuit 502 receives the outputs from threshold circuits 306 and 405 and produces a 1 level output signal on output line 16*b* whenever one of those circuits has been actuated to produce a 1 output. Similarly, OR circuits 503, 504, 505, 506, 507 and 508 receive their inputs from threshold circuits 308 and 406, 310 and 408, 312 and 410, 314 and 412, 316 and 414 and 318 and 416, respectively. The outputs from these OR circuits appear, respectively, on output lines 16*c*–16*h*. The output from $\bar{0}$ level and $\overline{10}$ level threshold circuits 319 and 305 in the positive comparator bank 300 appear on lines 13*i* and 13*a* and are transmitted directly through the circuit 500 to output lines 16*i* and 16*a*. As will hereinafter become apparent, the output which is generated on line 13*i* is used, during the first digit generation period, as an indication of the polarity of the analog input signal on input line 12.

Comparator register 600, also shown in FIG. 8*a*, comprises nine bistable logic circuits each consisting of a pair of AND circuits 608 and 610 and an OR circuit 606. As shown in the waveform diagram of FIG. 3, the waveform A, which is applied to terminal 602 of the register 600, is normally held at a positive level and is pulsed negatively to reset the register positions. In the reset condition, the outputs of both AND circuits 608 and 610 and the OR circuit 606 of each register position are in the down or 0 condition. When a positive B pulse is applied to terminal 604, all the right-hand AND circuits 608, each of which is also connected to an output line from the circuit 500, are partially enabled. Each AND circuit also receiving a 1 level signal from the comparator mix circuit 500 passes an output signal through its OR circuit 606. This signal is fed back to the input of AND 610 via line 612 and "latches" the output of AND 610 up due to the presence of the normally positive level applied at terminal 602. This output signal remains until a negative-going A reset pulse is applied at terminal 602. The output signals thus appearing on the output lines 18*a*–18*i* from the register 600 are a stored representation of the last occurring comparator firing pattern generated on comparator mix output lines 16*a*–16*i*.

The encode circuit 700 is also shown in FIG. 8*a*. The circuit 700 receives as its input the nine outputs appearing on the nine output lines 18*a*–18*i* from comparator register 600. These outputs, as just mentioned, represent the last occurring firing pattern of the threshold circuits in the comparator banks 300 and 400. When the analog input to the first digit generation stage is positive, the circuit 700 encodes this firing pattern during the first digit generation period so that the outputs on lines 20 represent a BCO digit expressing the magnitude of the voltage reference level of the actuated threshold circuit in comparator bank 300 having the highest reference level. The digit thus generated on the $\overline{4}$, $\overline{2}$ and $\overline{1}$ lines 20 is a true representation (assuming no comparator error) of the first (most significant) output digit. In the case of an analog input signal having a magnitude equal to or greater than $\overline{10}$ volts, a 1 level signal is generated on the P output line 20 as well as on the $\overline{4}$, $\overline{2}$ and $\overline{1}$ output lines. In this instance the signal on the P line indicates that the analog input is beyond the maximum positive range of the converted and the BCO digit on the $\overline{4}$, $\overline{2}$ and $\overline{1}$ lines 20 is not necessarily a true output digit.

When a negative analog signal level is presented at the converter input terminal 10, the circuit 700 operates, during the first digit generation period, to produce a 1 level signal on M output line 20 indicating the negative input polarity and to produce signals on the $\overline{4}$, $\overline{2}$ and $\overline{1}$ output lines 20 indicative of a digit which is the seven's complement of the true first output digit. Thus, for example, if the magnitude of the analog input signal is less than $-\overline{1}$ volt, but is not less than $-\overline{2}$ volts, the combination of signals appearing on the output lines 20 is 11010 representing a negative BCO $\overline{6}$, $\overline{6}$ being the seven's complement of $\overline{1}$, which is the true first (most significant) conversion digit.

Another way of expressing this relationship between the magnitude of the analog input signal and the output of encode circuit 700 generated in response to negative input signals to the first digit generation stage is that, except when the input signal is less than $\overline{0}$ but not less than $-\overline{1}$ volt, the BCO digit generated on the $\overline{4}$, $\overline{2}$ and $\overline{1}$ output lines 20 represents a digit which is the seven's complement of the absolute magnitude of the voltage reference level to which the actuated threshold circuit in the bank 400 having the most negative reference level is tied. In the case of an analog input signal having a level less than $\overline{0}$ volts but not less than $-\overline{1}$ volt, no threshold circuits in either of the comparator banks 300 or 400 are actuated. The circuit 700 responds to this all-zero input pattern by generating a BCO $\overline{7}$ representation on the $\overline{4}$, $\overline{2}$ and $\overline{1}$ output lines and a negative polarity indication on the M output line.

As shown in FIG. 8*a*, the circuit 700 comprises standard AND, OR and inverter logic circuits. The detailed operation of the circuit is best explained with reference to the truth table of FIG. 8*b*. The A group of inputs there shown is a summarization of all possible inputs to the circuit 700 that may occur during the first digit generation period. The encoded outputs corresponding to those inputs are shown on the right and the magnitudes of the analog input signals producing the inputs are indicated on the left. The table readily demonstrates the previously mentioned fact that the $\overline{0}$ volt threshold circuit in comparator bank 300 makes the initial determination of the polarity of the input. This is seen by the fact that the initial sign digit on the M output line is governed by the input on line 18*i*, which is taken from the output of the $\overline{0}$ volt threshold circuit. Also, the previously stated relationship between the magnitude of the input signal and the BCO digit representation generated on the $\overline{4}$, $\overline{2}$ and $\overline{1}$ output lines in response thereto is borne out. Thus, it is seen that for positive input voltages within the range of the converter (between $\overline{0}$ and $\overline{10}$ volts), the BCO representation generated on the $\overline{4}$, $\overline{2}$ and $\overline{1}$ output lines during the first digit generation period is a true representation of the most significant conversion digit while for negative input signals within the range of the converter (between $\overline{0}$ and $-\overline{10}$ volts) the BCO representation generated on the $\overline{4}$, $\overline{2}$ and $\overline{1}$ output lines is the seven's complement of the true first conversion digit. For input voltages which are beyond the positive range of the converter, the circuit 700 generates an output on the P line signifying the excessive condition of the input. However, no such indication is given during the first digit generation period for a negative out of range signal. At will be subsequently explained in connection with the operation of adder network 800, such an indication is produced during the second digit generation period.

Inasmuch as the converter of the invention operates on a bipolar basis only during the first digit generation period, its operation being on a positive, unipolar basis during the second and subsequent digit generation periods, the mode of operation of the circuit 700 must be altered after the first digit period. This is accomplished by the absence of the T1 timing pulse from terminal 701 (FIG. 8*a*) during the second and subsequent digit periods, causing AND 702 to be deconditioned. The operation of the circuit 700 in response to this condition is shown by the B group of inputs of FIG. 8*b*. As is noted, positive level analog input signals presented to the second and subsequent digit generation stages evoke the same response from the circuit 700 as did the same analog levels when presented to the first digit stage. However, all negative level input signals induce the same 00010 combination of output signals. This is because during digit generation periods subsequent to the first, the circuit 700 operates exactly in accordance with the principles expressed in the aforementioned co-pending application wherein signals on the M and P lines perform an error correction function rather than an overflow and sign indication function as in the above discussed A group of inputs.

DAC register 251

The circuit details of DAC register 251 are shown in FIG. 9. The DAC registers 252, 253 and 254 are constructed identically to the circuit 251, except that they respond to different timing pulses and their detailed descriptions are therefore unnecessary. The register 251 comprises five AND-OR latch circuits identical to those employed in the comparator register 600, previously described. The negative-going reset pulse G is applied to input terminal 258 from timing bus 23 and is transmitted to the right-hand AND circuits of each register position. The G pulse resets each latch circuit in the same manner, previously described, that the A pulse resets each of the latch circuits of the register 600. The BCO, sign and overflow signals presented from encode circuit 700 via the $\bar{4}$, $\bar{2}$, $\bar{1}$, M and P lines 20 are gated through the left-hand AND circuits of each of the five latches by the timing pulse C applied to input terminal 256 from timing bus 23 and are stored in the latches in the manner previously described with regard to the register 600. The BCO signals stored in the register appear on the $\bar{4}$, $\bar{2}$ and $\bar{1}$ output lines 27 thereof, the sign signal appears on the M line 27 and the overflow signal on the P line 27. These signals are transmitted to the inputs of an adder circuit in the adder network 800, described below, and, via the bus 27*a*, to the inputs of DAC circuit 201. As previously mentioned, signals appearing on the M and P output lines from the registers 252, 253 and 254 represent correction signals rather than sign and overflow signals.

Adder network 800

The general organization of adder network 800 is shown in FIG. 10. Five adder circuits 801, 802, 803, 804 and 805 receive the output signals from DAC registers 251, 252, 253, 254 and encode circuit 700, respectively. In addition, each adder circuit except circuit 805 receives a "carry" and "borrow" input signal from the adjacent right-hand adder circuit and each adder, with the exception of circuit 801, generates its own "carry" and "borrow" output signals which are transmitted to the adjacent left-hand adder circuit. Each adder circuit generates a three-bit BCO output digit on the respective output lines 60, 61, 62, 63 and 64. These digit signals represent the final corrected ADC output and are transmitted to the inputs of AND gates 900 for presentation to external circuitry upon the occurrence of gating pulse H. The circuit 801 does not generate "carry" and "borrow" signals but rather includes a supplementary circuit 801*a* which produces an "overflow" signal on line 65 and a "sign" signal on line 66. These signals are also presented to the inputs of AND gates 900 for external transfer. The signal on line 66 indicates the polarity of the digital output and is a 0 if the output is positive and a 1 if the output is negative. A 0 on overflow line 65 signifies that the digital output is valid and a 1 on the line 65 signifies that the output is invalid, the original input signal having been outside the range of the converter.

The circuit details of adder 801, supplementary sign circuit 801*a* and AND gates 900 associated therewith are shown in FIG. 11*a*. The inputs to adder 801 consist of the $\bar{4}$, $\bar{2}$, $\bar{1}$ and P output lines 27 from DAC register 251 and carry and borrow input lines C802 and B802 from adder 802. The outputs from adder 801 consist of a pair of lines 811 and 812 and three BCO digit lines 60. The signals appearing on the lines 60 which are gated through the corresponding AND circuits 901 by gating pulse H at the completion of a conversion cycle are a BCO representation of the most significant ADC output digit. The inputs to the supplementary circuit 801*a* consist of the M output line 27 from DAC register 251 and the lines 811 and 812 from the circuit 801. The outputs from the circuit 801*a* consist of the overflow output line 65 and the sign output line 66. The signals appearing on these two output lines are also connected to a pair of output AND gates 901 and are gated therethrough by the occurrence of the pulse H.

The circuits 801 and 801*a* comprise standard AND, OR and inverter logic circuits and their operation is best explained with reference to the truth tables of FIGS. 11*b* and 11*c*. Referring to FIG. 11*b*, the A group of inputs represent the digits $+\bar{0}$ through $+\bar{7}$ unaccompanied by either a P bit (indicative of an "out of range" original analog input) or a carry or borrow bit from adder 802. The outputs corresponding to these inputs are simply a transfer of the BCO input signals with a preservation of the positive sign indication.

The B group of inputs represent the negative BCO digits $\bar{7}$ through $\bar{0}$ (representative of true negative conversion digits $-\bar{0}$ through $-\bar{7}$) also unaccompanied by carry or borrow signals from adder 802. Again, the outputs are simply a transfer of the BCO inputs with the negative sign indication preserved.

The C group of inputs represent the digits $+\bar{0}$ through $+\bar{7}$ accompanied by a carry signal from adder 802. As noted from the corresponding outputs, the carry bit causes adder circuit 801 to add $\bar{1}$ to the BCO input digit. Note that the carry causes generation of an overflow indication when the BCO inputs represent a $\bar{7}$. Also note that the carry input does not change the signal of the input.

The D group of inputs represent the negative BCO digits $\bar{7}$ through $\bar{0}$ (indicating true conversion digits of $-\bar{0}$ through $-\bar{7}$) accompanied by a carry signal from adder 802. As noted from the outputs, the carry signal causes the added to add $\bar{1}$ to the BCO input signals (making the true output digit more positive by $\bar{1}$). Note that when the BCO input is a $\bar{7}$ (top row), the carry signal has the effect of causing the sign indicated by the output to be different from that indicated by the input. Thus, in adding $\bar{1}$ to the $-\bar{7}$ indicated by the input (a true $-\bar{0}$) the resultant output is a $+\bar{0}$ representation.

The E group of inputs represent the digits $+\bar{0}$ through $+\bar{7}$ accompanied by a borrow signal from adder 802. As noted from the corresponding outputs, the borrow bit results in an output BCO digit which is $\bar{1}$ less than the input digit. As is indicated in the top row, when the input BCO digit is $+\bar{0}$ the borrow signal causes the circuit 801 to transfer a $-\bar{7}$ digit (a true $-\bar{0}$) in its place.

The F group of inputs represent the digits $-\bar{7}$ through $-\bar{0}$ (indicating the true digits $-\bar{0}$ through $-\bar{7}$) accompanied by a borrow input from adder 802. As noted by the corresponding outputs, the effect of the borrow signal is to cause the circuit 801 to reduce the BCO input digit by $\bar{1}$ while preserving the minus sign representation. Note that a negative overflow indication is produced when a borrow is presented along with a BCO input digit of $-\bar{0}$ (a true $-\bar{7}$). As previously mentioned, this overflow output signal (discussed in more detail below) indicates that the original analog input exceeded the negative range of the converter and the digital output generated in response thereto is not necessarily valid.

The remaining possible input combinations into the circuits 801–801*a* and the corresponding outputs are shown in the truth table of FIG. 11*c*. The G group of inputs represent the inputs which are presented to the circuits 801–801*a* in the event an out of range input signal is detected during the first digit generation period. A positive out of range input signal, represented by the top row of inputs, results in the production of a P "out of range" output signal from the circuit 700 during the initial digit period, and thus an overflow signal is immediately produced on output line 65 from the circuit 801*a*. A negative out of range signal, represented by the second row of inputs, on the other hand, is not detected during the first digit generation period since the circuit 700 encodes an input signal which is less than $-\overline{10}$ volts the same as the input signal which is less than $-\bar{7}$ but not less than $-\overline{10}$ volts (see the last two input combinations in the A group of FIG. 8*b*). This is because there is no $-\overline{10}$ threshold circuit in comparator bank 400, such a circuit being superfluous since the encoding circuit 700 is not capable of providing an indication of a negative out of range signal during the first digit period (the M output line being used to provide a sign rather than an error indication during this period). In the case of a negative overflow signal at the input, no overflow indication is produced until after the second digit generation period has resulted in the transfer of a borrow signal from adder 802 to adder 801 and the combination of inputs into the circuit 801 assumes the form shown in the last line of the F group of inputs discussed above.

Finally, the H group of inputs completes the discussion of the operation of the circuit 801 when an out of range signal is detected during the first digit generation period. The top row of inputs and corresponding outputs represent the final state of the circuit 801–801*a* when a true positive out of range signal is presented at input terminal 10. The first five digits of the input result from the initial detection of the out of range signal. The carry signal results when this out of range indication is verified by the detection of a second out of range signal during the second digit generation period. This initiates the "overflow" correction procedure which causes a carry signal to be trnasferred to adder 801 causing the output therefrom to represent an overflow and a BCO $\overline{1}$ digit. The second row of inputs represents the final state of the circuits 801–801*a* when an erroneous positive out of range detection is made during the first digit generation period. The erroneous initial comparison causes the "underflow" correction procedure to be initiated during the second digit generation period, resulting in the transfer of a borrow signal to adder 801, changing the output thereof from a BCO $\overline{0}$ with an overflow indication to a BCO $\overline{7}$ with no overflow indication. The last row of inputs represents the final state of the circuits 801–801*a* when the original analog input signal exceeds the maximum negative range of the converter is presented. This condition has been discussed previously.

Referring now to FIG. 12*a*, the circuit details of adder 802 and the AND gates 900 associated therewith are hereinafter described. The adder circuits 803, 804 and 805 and the AND gates associated therewith are identical to the circuit of FIG. 12*a* and therefore are not herein described in detail. The inputs to adder 802 consist of the five output lines 28 from DAC register 252 and carry and borrow input lines C803 and B803 from adder 803. The outputs from adder 802 consist of carry and borrow lines C802 and B802 and three BCO digit lines 61. The signals appearing on the lines 61 which are gated through the corresponding AND circuits 901 by gating pulse H at the completion of a conversion cycle are a BCO representation of the second most significant ADC output digit.

The circuit 802 comprises standard AND, OR and inverter logic circuits and its operation is best explained with reference to the truth table of FIG. 12*b*. The A group of inputs represent the digits $\overline{0}$ through $\overline{7}$ unaccompanied either by correction bits or by carry or borrow bits from adder 803. The outputs corresponding to these combinations of inputs are simply a transfer of the BCO input signals.

The B group of inputs represent the BCO digits $\overline{0}$ through $\overline{7}$ accompanied by a carry input bit from adder 803. As noted from the corresponding outputs, the carry bit causes the adder to add $\overline{1}$ to the BCO input digit. Note that a carry signal is generated at the adder output when the BCO input digit is $\overline{7}$.

The C group of inputs represent the digits $\overline{0}$ through $\overline{7}$ accompanied by a borrow signal from adder 803. The borrow signal causes the adder to subtract $\overline{1}$ from the BCO input digit. Note that when the input signals represent a BCO $\overline{0}$, the output signals represent a BCO $\overline{7}$ with a borrow.

The D group of inputs illustrate the operation of the adder circuit in performing digital correction in response to underflow and overflow conditions detected in the comparator bank and set up by the encode circuit. The first inputs represent a BCO $\overline{0}$ accompanied by an M correction bit. In response to this combination of inputs the adder circuit generates at its output a BCO $\overline{7}$ and a borrow signal. For overflow correction, the input signal represent a BCO $\overline{7}$ accompanied by a P correction bit. The circuit corrects this to a BCO $\overline{0}$ with a carry signal.

The E group of inputs show the inputs for underflow and overflow correction accompanied by either a carry or a borrow signal from adder 803. The top row of inputs are those produced in an underflow correction situation with a carry from adder 803. The effect of the carry input is to cause the adder to add $\overline{1}$ to the normal underflow correction output with the result that the BCO $\overline{7}$ signals are changed to BCO $\overline{0}$ signals and the borrow is canceled. The second row of inputs represent underflow correction inputs accompanied by a borrow signal from adder 803. The circuit thus subtracts $\overline{1}$ from the normal underflow correction output with the result that the BCO $\overline{7}$ signals are changed to BCO $\overline{6}$ signals. The third row of inputs are the overflow correction inputs accompanied by a carry. The effect of the carry signal is to cause the circuit to add $\overline{1}$ to the normal combination of overflow correction outputs which produces BCO signals representing a $\overline{1}$ with a carry. The last line of inputs are overflow correction inputs accompanied by a borrow. In subtracting $\overline{1}$ from the normal overflow correction outputs, the circuit changes the signals representing a BCO $\overline{0}$ to signals representing a BCO $\overline{7}$ and cancels the carry.

While the embodiment of the invention herein described performs a conversion in the octal number system, it is to be understood that the circuit could, by slight modification, be made to operate in any number system. For example, to perform a decimal conversion, two more threshold circuits would have to be added to each of the comparator banks 300 and 400. Also, two more storage positions would have to be added to the comparator register 600, and encode circuit 700 would require modification to converter the firing pattern on the 11 output lines of the register 600 to binary-coded-decimal. One additional output line 20 would be needed to represent the "8" digit position, and an extra storage position would accordingly have to be added to each of the storage registers 251, 252, 253 and 254. Further, an extra input switch and resistor would be required in each of the DAC circuits 201, 202, 203 and 204 with a proper alteration in the parameters of those circuits and the circuits of the radix amplifies such that the amplifies would povide a gain of 10.

Futher, although the extent of quantization provided by the embodiment of the invention herein described is 5 digits, this is in no way intended to serve as a limitation since any number of digit stages, within reasonable limits allowing for circuit practicalities, may be utilized.

It is apparent that greatly improved bipolar analog to digital conversion is accomplished by the ADC circuit herein described inasmuch as hadrware savings are afected by the use of what is essentially a unpiolar converter having only its first digit stage circuits slightly modified for bipolar operation. Further, novel error correction means are provided to correct both the sign and digit representations of the converter output which result from an initial comparison which incorrectly judges the polarity of the input. Furthermore, digital outputs are automatically generated in accordance with the digital complement form of sign notation.

While the invention has been particularly shown and described with reference to a preferred embodiment thereof, it will be understood by those skilled in the art that the foregoing and other changes in form and details may be made therein without departing from the spirit and scope of the invention.

We claim:

1. A circuit for peforming an analog to digital conversion, comprising:

means for supplying an analog signal;

signal level detection means receiving said analog signal and producing a signal level indication in response thereto;

encoding means for converting said signal level indication to a first digit of said conversion;

difference means for producing an error signal indicative of the difference between a level having a predetermined relationship to the value of said first digit and the magnitude of said analog signal, said relationship being such that said error signal is caused to have the same polarity regardless of the polarity of said analog signal; and means for removing said analog signal from said signal level detection means and for transmitting said error signal to said signal level detection means to cause said encoding means to generate a second digit of said conversion.

2. A circuit for peforming an analog to digital conversion, comprising:

means for supplying an analog signal;

bipolar signal level detection means receiving said analog signal and producing a signal level indication in response thereto;

encoding means for generating in response to said signal level indication a representation of the polarity of said analog signal and a representation of a first digit of said conversion, said digit representation being complementary to the true first digit of said conversion when said analog signal is negative;

difference means for subtracting a level determined by said first digit representation from the magnitude of said analog signal and producing an error signal indicative of the difference; and means for removing said analog signal from said signal level detection means and for transmitting said error signal to said signal level detection means to cause said encoding means to generate a representation of a second digit of said conversion.

3. A circuit for performing an analog to digital conversion, comprising:

means for supplying an analog signal;

bipolar signal level detection means receiving said analog signal and producing a signal level indication in response thereto;

encoding means for converting said signal level indication to a representation of a first digit of said conversion, said digit representation being complementary to the true first digit of said conversion when said analog signal is negative;

difference amplifying means for subtracting a level determined by said digit representation from the magnitude of said analog signal to produce an error signal indicative of the magnitude of the difference amplified by a radix factor; and means for removing said analog signal from said signal level detection means and for transmitting said error signal to said signal level detection means to cause said encoding means to generate a representation of a second digit of said conversion.

4. A circuit for performing an analog to digital conversion, comprising:

means for supplying an analog signal;

bipolar signal level detection means receiving said analog signal and producing a signal level indication in response thereof;

encoding means for generating in response to said signal level indication a first representation of the polarity of said analog signal and a representation of a first digit of said conversion, said digit representation being complementary to the true first digit of said conversion when said analog signal is negative;

difference means for subtracting a level determined by said digit representation from the magnitude of said analog signal and producing an error signal indicative of the magnitude of the difference;

means for removing said analog signal from said signal level detection means and for transmitting said error signal to said signal level detection means to cause said encoding means to generate a representation of a second digit of said conversion; and correction means operative when the magnitude of said error signal lies outside the range of said signal level detection means and when said representation of said first digit possesses a predetermined value to generate a second representation of the polarity of said analog signal, said second representation being the reverse of said first representation.

5. A circuit for performing an analog to digital conversion, comprising:

means for supplying an analog signal;

bipolar signal level detection means receiving said analog signal and producing a signal level indication in response thereto;

encoding means for generating in response to said signal level indication a first representation of the polarity of said analog signal and a representation of a first digit of said conversion, said digit representation being complementary to the true first digit of said conversion when said analog signal is negative;

difference amplifying means for subtracting a level determined by said digit representation from the magnitude of said analog signal to produce an error signal indicative of the magnitude of the difference amplified by a radix factor;

means for removing said analog signal from said signal level detection means and for transmiting said error signal to said signal level detection means to cause said encoding means to generate a representation of a second digit of said conversion; and correction means operative when the magnitude of said error signal lies outside the range of said signal level detection means and when said first digit representation possesses a predetermined value to generate a second representation of the polarity of said analog signal, said second representation being the reverse of said first representation.

6. A circuit for performing an analog to digital conversion, comprising:

means for supplying an analog signal;

bipolar signal level detection means receiving said analog signal and producing a signal level indication in response thereto;

encoding means for generating in response to said signal level indication a first representation of the polarity of said analog signal and a representation of a first digit of said conversion, said digit representation being complementary to the true first digit of said conversion when said analog signal is negative;

means for storing said first polarity representation and said representation of said first digit;

output means for transferring said stored representations for external utilization;

difference amplifying means for subtracting a level determined by said representation of said first digit from the magnitude of said analog signal to produce an error signal indicative of the magnitude of the difference amplified by a radix factor;

means for removing said analog signal from said signal level detection means and for transmitting said error signal to said signal level detection means to cause said encoding means to generate a representation of a second digit of said conversion; and correction means operative when the magnitude of said error lies outside the range of said signal level detection means and when said stored representation of said first digit possesses a predetermined value to condition said output means to transfer in place of said stored polarity and digit representations a second polarity representation opposite said first representation and a digit representation complementary to said representation of said first digit.

7. A circuit for performing an analog to digital conversion, comprising:

means for supplying an analog signal;

bipolar signal level detection means receiving said analog signal and producing a signal level indication in response thereto;

encoding means for generating in response to said signal level indication a first representation of the polarity of said analog signal and a representation of a first digit of said conversion, said digit representation being complementary to the true first digit of said conversion when said analog signal is negative;

means for storing said first polarity representation and said representation of said first digit;

difference amplifying means for subtracting a level having a predetermined relationship to the value of said stored digit representation from the magnitude of said analog signal to produce an error signal indicative of the magnitude of the difference amplified by a radix factor;

means for removing said analog signal from said signal level detection means and for transmitting said error signal to said signal level detection means to cause said encoding means to generate a representation of a second digit of said conversion;

means for storing said representation of said second digit;

output means for transferring said stored polarity and digit representations for external utilization; and correction means operative when the magnitude of said error signal lies outside the range of said signal level detection means to condition said output means to transfer a complementary digit representation in place of said representation of said second digit and further, when said representation of said first digit possesses a predetermined value, to condition said output means to transfer an opposite polarity representation and a complementary digit representation in place of said first polarity representation and said representation of said first digit, respectively.

8. A circuit for performing an analog to digital conversion, comprising:

means for supplying an analog signal;

bipolar signal level detection means receiving said analog signal and producing a signal level indication in response thereto;

encoding means for generating in response to said signal level indication a first representation of the polarity of said analog signal and a representation of a first digit of said conversion, said digit representation being complementary to the true first digit of said conversion when said analog signal is negative;

difference amplifying means for subtracting a level determined by said digit representation from the magnitude of said analog signal to produce an error signal indicative of the magnitude of the difference amplified by a radix factor;

means for removing said analog signal from said signal level detection means and for transmitting said error signal to said signal level detection means to cause said encoding means to generate a representation of a second digit of said conversion; and correction means operative when the magnitude of said error signal lies outside the range of said signal level detection means and when said first polarity representation is a plus and said representation of said first digit is a zero to generate a minus polarity representation.

9. The analog to digital converter of claim 8 wherein said correction means further includes means for generating digit representations which are complementary to said representations of said first and second digits.

10. A circuit for performing an analog to digital conversion, comprising:

means for supplying an analog signal;

bipolar signal level detection means receiving said analog signal and producing a signal level indication in response thereto;

encoding means for generating in response to said signal level indication a first representation of the polarity of said analog signal and a representation of a first digital of said conversion, said digit representation being complementary to the true first digit of said conversion when said analog signal is negative;

difference amplifying means for subtracting a level determined by said digit representation from the magnitude of said analog signal to produce an error signal indicative of the magnitude of the difference amplified by a radix factor;

means for removing said analog signal from said signal level detection means and for transmitting said error signal to said signal level detection means to cause said encoding means to generate a representation of a second digit of said conversion; and correction means operative when the magnitude of said error signal lies outside the range of said signal level detection means and when said first polarity representation is a minus and said representation of said first digit is the complement of zero to generate a plus polarity representation.

11. The analog to digital converter of claim 10 wherein said correction means further includes means for generating digit representations which are complementary to said representations of said first and second digits.

References Cited

UNITED STATES PATENTS 3,157,873 11/1964 Slack -------------- 340—347

MAYNARD R. WILBUR, Primary Examiner
CHARLES D. MILLER, Assistant Examiner

U.S. Cl. X.R.

235—155